(12) United States Patent
Furse et al.

(10) Patent No.: US 7,271,596 B2
(45) Date of Patent: Sep. 18, 2007

(54) METHOD AND SYSTEM FOR TESTING A SIGNAL PATH HAVING AN OPERATIONAL SIGNAL

(75) Inventors: Cynthia Furse, Salt Lake City, UT (US); Chet Lo, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 11/231,520

(22) Filed: Sep. 16, 2005

(65) Prior Publication Data

US 2006/0039322 A1    Feb. 23, 2006

Related U.S. Application Data

(63) Continuation-in-part of application No. PCT/US2004/008165, filed on Mar. 17, 2004, and a continuation-in-part of application No. 11/133,145, filed on May 18, 2005, which is a continuation-in-part of application No. PCT/US03/37233, filed on Nov. 19, 2003.

(60) Provisional application No. 60/477,391, filed on Jun. 9, 2003, provisional application No. 60/459,482, filed on Mar. 31, 2003, provisional application No. 60/455,788, filed on Mar. 18, 2003, provisional application No. 60/427,737, filed on Nov. 19, 2002.

(51) Int. Cl.
    *G01R 31/11*    (2006.01)
(52) U.S. Cl. ........................ 324/533; 324/534
(58) Field of Classification Search ................ 324/533, 324/534
    See application file for complete search history.

(56) References Cited

U.S. PATENT DOCUMENTS

| | | |
|---|---|---|
| 5,083,086 A | 1/1992 | Steiner ...................... 324/533 |
| 5,276,703 A | 1/1994 | Budin et al. ................ 375/130 |
| 5,369,366 A | 11/1994 | Piesinger .................... 324/533 |
| 5,448,222 A * | 9/1995 | Harman ...................... 340/566 |
| 5,488,310 A | 1/1996 | Baker et al. ................ 324/648 |
| 5,640,431 A * | 6/1997 | Bruckert et al. ............ 375/344 |
| 6,061,393 A | 5/2000 | Tsui et al. .................. 375/224 |
| 6,161,077 A * | 12/2000 | Fawcett ....................... 702/58 |
| 6,370,207 B1* | 4/2002 | Weill et al. ................. 375/341 |
| 6,477,476 B1 | 11/2002 | Wong-Lam et al. .......... 702/66 |
| 7,069,163 B2* | 6/2006 | Gunther et al. ............... 702/79 |
| 2001/0038667 A1* | 11/2001 | Urabe et al. ................ 375/152 |
| 2002/0161539 A1 | 10/2002 | Jones et al. ................... 702/79 |

* cited by examiner

*Primary Examiner*—Walter Benson
*Assistant Examiner*—Amy He
(74) *Attorney, Agent, or Firm*—Thorpe North & Western LLP

(57) ABSTRACT

A technique for testing a signal path while an operational signal is present is disclosed. The technique may be performed without injecting a test signal into the signal path by using an operational signal already present in the signal path. A method of testing a signal path includes receiving an operational signal from the signal path and estimating a correlation of the operational signal. A system for testing a signal path includes an extractor configured to extract a sample of the operational signal when coupled to a signal path and a correlator configured to estimate a correlation of the operational signal. Various properties of the signal path may be determined using the technique.

35 Claims, 15 Drawing Sheets

METHOD AND SYSTEM FOR TESTING A SIGNAL PATH HAVING AN OPERATIONAL SIGNAL

This application is a continuation-in-part of copending PCT Application No. PCT/US2004/008165 entitled "Method and System for Testing A Signal Path Having an Operational Signal" filed on Mar. 17, 2004 which claims the benefit of U.S. Application No. 60/455,788 filed on Mar. 18, 2003 entitled "Noise Domain Reflectometer Apparatus and Method for Determining the Integrity and/or Lengths of Signal Paths."

This application is also continuation-in-part of copending U.S. application Ser. No. 11/133,145 filed on May 18, 2005 entitled "Device and Method for Detecting Anomalies in a Wire and Related Sensing Methods" which is a continuation-in-part of PCT Application No. PCT/US03/37233 filed on 19 Nov. 2003 entitled "Device and Method for Detecting Anomalies in a Wire and Related Sending Methods" which claims the benefit of U.S. Application No. 60/427,737 filed on 19 Nov. 2002 entitled "Handheld Device for Detecting Open, Short and Location of Anomaly on a Wire," U.S. Application No. 60/455,788 filed on 18 Mar. 2003 entitled "Noise Domain Reflectometer Apparatus and Method for Determining the Integrity and/or Lengths of Signal Paths," U.S. Application No. 60/459,482 filed on 31 Mar. 2003 entitled "Mixed Signal Reflectometer Apparatus and Method for Determining the Integrity of Signal Paths," and U.S. Application No. 60/477,391 filed on 9 Jun. 2003 entitled "Method and System for Robust Multi-Carrier Spread Spectrum Data Transmission over Partially Jammed Channels."

All of the above applications are hereby incorporated by reference for all that they disclose and for all purposes.

BACKGROUND OF THE INVENTION

The present invention relates generally to the field of electronic system testing. More particularly, the present invention relates to devices and methods for testing signal paths in electronic systems.

Electronic systems are prevalent in the modern world, and reliable operation of these devices is highly desirable. An important component of electronic systems are the signal paths within those systems. Signal paths can be provided by wires, cables, circuit board traces, wireless links, and the like. Signal paths may be relatively short, for example, a connection between two components in a circuit, or relatively long, for example miles of wiring used in a telephone system. Unfortunately, the reliability of an electronic system can be adversely affected by an anomaly in one of its signal paths.

For example, aircraft provide a particularly poignant example: failures in the wiring of an aircraft can cause catastrophic results. Aircraft wiring can prove difficult to test, however, at it is often inaccessible. Furthermore, intermittent failures can occur in flight that are difficult to reproduce under the differing vibration, altitude, temperature, and humidity conditions that occur on the ground. Productive time is lost when aircraft must be grounded; yet, technicians may be unable to find the cause of a failure.

Testing of signal paths in electronic systems can be difficult, however, as wires are often inaccessible, hidden behind panels, wrapped in protective jackets, or otherwise difficult to access. Removal of wires for testing or inspection can cause damage, and even if the wires are functioning properly upon inspection, reinsertion of the wires into the system can cause damage.

Testing of signal paths also typically requires shutting the system down while the testing is being performed. For example, testing often requires applying a small voltage to the signal path and measuring the resulting current to test for open or short circuits. If an operational signal is present, the measurement may be erroneous. More sophisticated techniques involve injecting other types of test signals into the signal path, and can be disrupted if an operational signal is present. Furthermore, injecting a test signal into the signal path while the system is operational can result in disruption to the system. Shutting down the system for testing can be both inconvenient and expensive if revenues are lost while the system is shut down. Furthermore, some types of intermittent faults may be very difficult to detect in this manner.

SUMMARY OF THE INVENTION

It has been recognized it would be advantageous to develop a technique for testing signal paths that can be used while an operational signal is present. An "operational signal" refers a signal present within the system during operation. Accordingly, the inventive technique can be performed without injecting a test signal into the signal path.

A first embodiment of the present invention includes a method of testing a signal path. The method may include receiving an operational signal from the signal path, wherein the operational signal has distortion introduced by reflections within the signal path. The method may further include estimating a correlation of the operational signal at a time-offset. The method may further include determining a characteristic of the signal path from the correlation.

There are numerous applications for the method. For example, because the method may be performed while an operational signal is present, detection of intermittent anomalies in the signal path is enhanced. The method can be performed continuously, hence intermittent anomalies, such as open circuits, short circuits, and arc faults, can be detected and recorded when they occur. Moreover, by estimating the correlation of the operational signal, no additional test signal need be injected, reducing the possibility of interference to the operational signal.

Additional features and advantages of the invention will be apparent from the detailed description which follows, taken in conjunction with the accompanying drawings, which together illustrate, by way of example, features of the invention.

DETAILED DESCRIPTION

Figure 1:
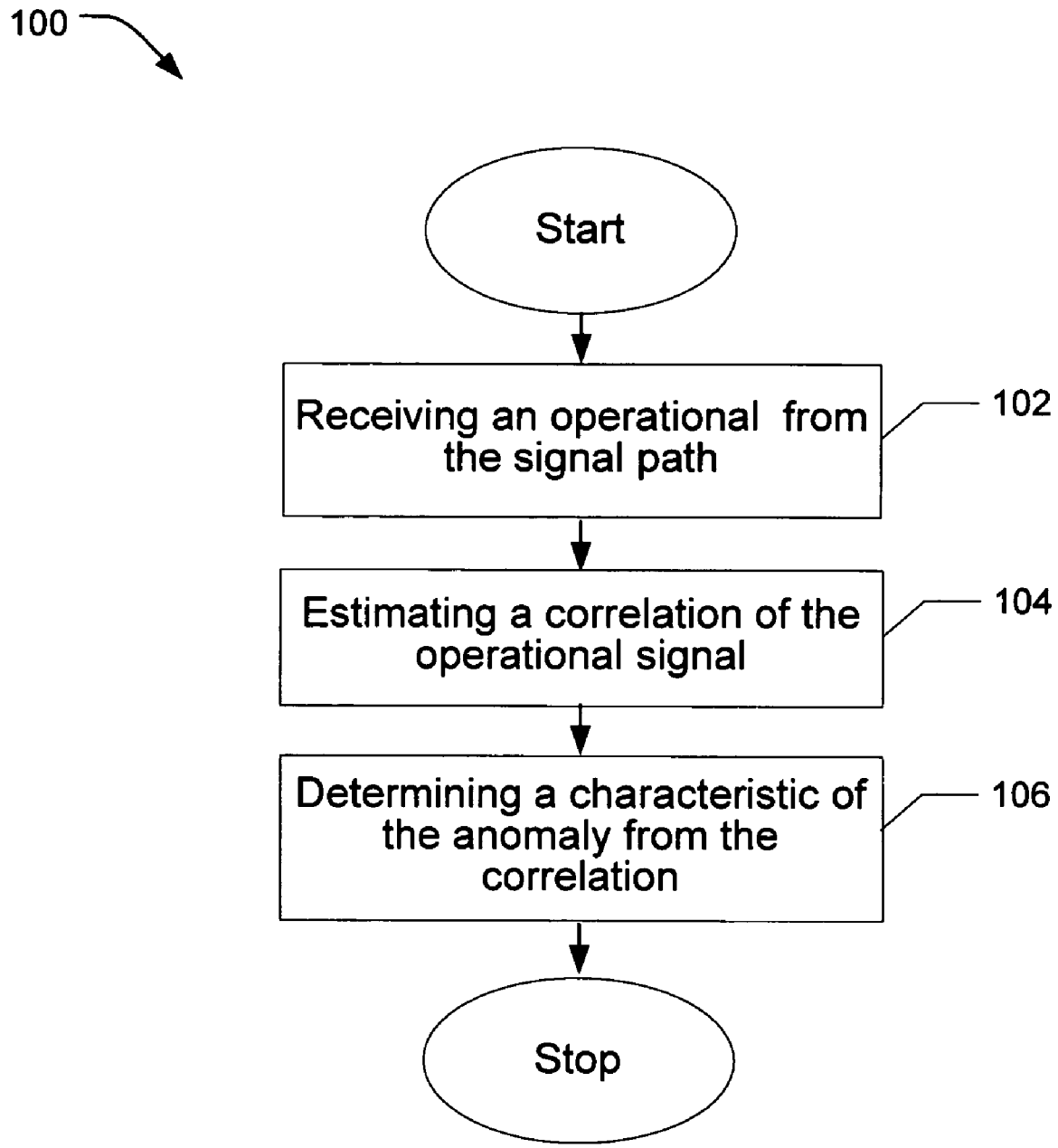
FIG. 1 is a flow chart of a method of testing a signal path in accordance with an embodiment of the present invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

First, in order to understand the presently disclosed inventive concepts, a review of the principles of reflectometry and correlation may prove helpful. Time domain reflectometry (TDR) involves injecting a short duration pulse into a signal path under test. The pulse will propagate in a forward direction along the signal path, yet small amounts of energy from the pulse will be reflected back by impedance discontinuities in the signal path. For example, an anomaly such as an open or short circuit results in such an impedance discontinuity. Similarly, a break in a shield or insulation may result in an impedance discontinuity. Intermittent shorts or opens (include wet and dry arc faults) may also result in intermittent impedance discontinuities. The term anomaly is used broadly, herein, and is meant to encompass anything within the signal path that causes a reflection, including for example and not by way of limitation, an impedance discontinuity, short circuit, open circuit, end of wire, wire junction, etc.

Hence, by observing the response of the signal path to the injected pulse, the presence of an anomaly may be detected. Distance to an anomaly may also be determined if the propagation velocity in the signal path is known. Furthermore, if no anomaly is present (for example, a signal path terminated with its characteristic impedance) there will be generally no reflections.

Correlation is a technique for measuring the similarity of two signals (or the similarity of a time-shifted version of a signal with itself). In general, an operational signal is an electrical signal present in an operating system. As the potential applications of the present invention are broad, operational signals may take on many forms. A few of the many examples include control signals within aircraft wiring, data signals on an Ethernet cable, and a wireless signal propagating through space.

The correlation of two signals f(t) and g(t) for time-offset $\tau$ is defined as $$\phi_{fg}(\tau) = E\{f(t)g(t-\tau)\} \tag{1}$$

where $E\{\ \}$ is the expectation operator, and f(t) and g(t) are treated as random variables.

There are various ways to estimate the correlation for operational signals. For example, the expectation can be expressed as:

$$\phi_{fg}(\tau) = \int_{-\infty}^{\infty} f(t)g(t-\tau)dt \tag{2}$$

For causal signals, this integration need only be performed for t>0, and the resulting correlation is an even function. That is to say, $$\phi_{fg}(\tau) = \phi_{gf}(-\tau) = \phi_{fg}(-\tau) \tag{3}$$

For the case where and f(t) and g(t) are different operational signals, this type of correlation is referred to as cross-correlation. For the case where f(t) and g(t) are the same signal (or time-shifted versions of the same signal), this type of correlation is referred to as auto-correlation, and is expressed as $$\phi_f(\tau) = \int_{-\infty}^{\infty} f(t)f(t-\tau)dt \tag{4}$$

It is known that the autocorrelation will have a positive extremum for a time-offset of $\tau=0$. Depending on the statistical properties of the signal, the autocorrelation may also have other extrema (positive or negative). For example, a periodic signal is known to have a series of extrema in the autocorrelation at time-offsets that are a multiple of the period of the signal. It is also known that a random or pseudo-random signal will have generally low autocorrelation for time-offsets other than zero.

Similarly, when correlating a signal f(t) with a time shifted version of itself, $g(t)=\alpha f(t+\delta)$, the correlation will have an extremum when $\tau=\delta$. Whether this extremum is positive or negative will depend, in part, on the reflection coefficient, $\alpha$.

An estimate of the correlation may be found by performing a short time integration $$\phi_{fg}(\tau) \approx \int_0^T f(t)g(t-\tau)dt \tag{5}$$

The accuracy of this approximation can be appreciated by considering the example of a digital data signal. The data contained in the digital signal is essentially random when viewed on a bit by bit basis. If the integration time T is taken to include several bits of data, for example, 10 bits, then the statistics of the data bits ensure that the autocorrelation will be small for time-offsets other than zero. This property is referred to as being shift-uncorrelated.

With the above principles in mind, the operation of a first embodiment of the present invention can now be described. FIG. 1 provides a flow chart of a method 100 of testing a signal path in accordance with an embodiment of the present invention. The method may include receiving 102 an operational signal from the signal path. The method may further include estimating 104 a correlation of the operational signal at a time-offset. The method may further include determining 106 a characteristic of the signal path from the correlation.

For example, the operational signal may have distortion introduced by reflections within the signal path. Reflections may be caused by impedance discontinuities, faults, junctions, ends of wires, etc., referred to as noted above as an anomaly. For example, open or short circuit conditions produce an impedance discontinuity and corresponding reflections. An anomaly may be a transient or long-lasting, for example an intermitted open or short circuit. An anomaly may be a partially open or partially shorted circuit. Reflections may be generated by the end of the signal path or junctions within the signal path. There may be no reflections generated within the signal path, for example if the signal path is terminated in its characteristic impedance.

The reflected portion (if any) of the operational signal may superimpose on the operational signal, resulting in distortion to the operational signal. The operational signal may be an existing signal present in the signal path used by the operational system. The method 100 can therefore operate without injecting a test signal into the system. Hence, testing the signal path can be performed while the system is operational. This may enhance the ability to detect transient or intermittent anomalies, for example, a short circuit or arc fault that only occurs during operation. Additionally, interference to the system operation may be avoided since no test signal need be injected into the system.

Receiving 102 the operational signal may be accomplished in a variety of ways. For example, a sample of the operational signal may be taken by making a direct electrical connection to the signal path. Alternately, a sample of the operational signal may be taken by inductively or capacitively coupling to the signal path. Receiving the operational signal may include receiving a main portion of the operational signal separately from a reflected portion of the operational signal. For example, this may be accomplished by directionally coupling to the signal path.

Correlating the operational signal may be accomplished in a variety of ways. For example, the correlation may be estimated by estimating a cross-correlation of the main portion of the operational signal and the reflected portion of the operational signal. This cross-correlation will have a peak (extremum) at the time-offset corresponding to the delay between the main portion and the reflected portion of the operational signal. Alternately, the correlation may be estimated by estimating an autocorrelation of the operational signal.

A technique for estimating correlation has been described above; additional techniques are described in further detail below. Various other techniques for estimating correlation are known in the art and are to be considered within the scope of the present invention.

In accordance with another embodiment of the present invention, estimating 104 the correlation of the operational signal may be performed by sampling the operational signal at a plurality of first sample times to form a plurality of first samples. Estimating the correlation may further include sampling the operational signal at a plurality of corresponding second sample times to form a plurality of second samples wherein each second sample time is delayed by a time-offset from each first sample time. Estimating the correlation may further include multiplying each of the plurality of first samples by the corresponding second samples to form a plurality of products. Estimating the correlation may further include summing the plurality of products to form the correlation. This summation may be performed by an integrator.

In accordance with another embodiment of the present invention, the method 100 may further include frequency-shifting a spectrum of the operational signal to produce a frequency-shifted signal, and wherein estimating an autocorrelation is estimated from the frequency-shifted signal. Frequency-shifting the operational signal may provide a more convenient format for use in estimating the correlation. For example, where the operational signal is approximately bandwidth-limited about a radio frequency, the operational signal may be frequency-shifted to a lower intermediate frequency (or even to zero frequency).

In accordance with another embodiment of the present invention, determining 106 a characteristic of the signal path may include comparing the correlation to a baseline correlation. For example, a baseline correlation may be estimated and saved when the signal path is known to have no anomalies. At a later time, when an anomaly is present, the correlation may show different or additional peaks due to the presence of the anomaly. Since the method 100 can be performed while an operational signal is present in the signal path, the ability to detect intermittent anomalies may thus be enhanced over prior art techniques. In accordance with another embodiment of the present invention, a baseline correlation may be estimated and saved continuously or periodically, for example to detect short-term changes in the signal path characteristics.

In accordance with another embodiment of the present invention, determining 106 a characteristic of the signal path may include determining the length of the signal path. For example, the end of an unterminated wire will result in a reflection. This reflection will cause an extremum in the correlation. The time-offset corresponding to this peak can be translated into a distance as discussed below.

Figure 2:
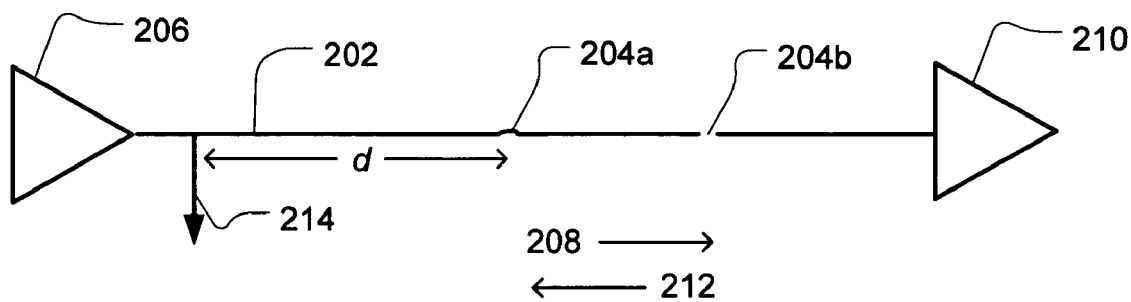
FIG. 2 is an illustration of an exemplary signal path having a plurality of anomalies.

The operation of the method 100 may be further understood in reference to FIG. 2. FIG. 2 illustrates an exemplary signal path 202 having two anomalies, 204a, 204b.

An operational signal is present in the signal path, having been generated by a first component 206 of the operational system. A main portion of the operational signal, generated by the component, travels in a forward direction 208 toward a second component 210 of the operational system. Upon encountering the anomalies 204, a reflected portion of the operational signal is generated which travels in a reverse direction 212 toward the first component. The reflected portion will superimpose on the main portion of the operational signal. The relative delay between the reflected portion and the main portion will depend on the distance d between the observation point 214 and the anomaly 204. The main portion of the operational signal propagates from the observation point to the anomaly, and then the reflected portion propagates back, for a total round-trip distance of $2d$. Hence, if the propagation velocity in the signal path is c, the relative delay is equal to $2d/c$.

The operation of the method 100 may be illustrated mathematically. We designate the main portion of the operational signal f(t). The reflected portion of the operational signal is thus given by $$r(t) = \sum_{i=1}^{N} \alpha_i f(t - \tau_i), \quad (6)$$

where N is the number of anomalies in the path, $\tau_i$ is the delay associated with each anomaly, and $\alpha_i$ is the amplitude of the reflection associated with the $i^{th}$ anomaly.

In accordance with an embodiment of the present invention, the main portion of the operational signal and the reflected portion of the operational signal may be separated, and the correlation estimated by estimating a cross-correlation of the main portion of the operational signal and the reflected portion of the operational signal.

A cross-correlation between the main portion of the operational signal f(t) and the reflected portion of the operational signal r(t) is thus given by $$\phi(\lambda) = \int f(t - \lambda) \sum_{i=1}^{N} \alpha_i f(t - \tau_i) dt. \quad (7)$$

where $\lambda$ is the time-offset for which the cross-correlation is to be estimated, and the limits on the integration have been omitted for simplicity of notation. The cross-correlation may be estimated for a plurality of time-offsets in accordance with an embodiment of the present invention.

By exchanging the order of the integration and summation, and using equation (4), this can be rewritten as $$\phi(\lambda) = \sum_{i=1}^{N} \alpha_i \phi_f(\tau_i - \lambda). \quad (8)$$

where $\phi_f$ is the autocorrelation of the forward portion of the operational signal. Hence, peaks (positive or negative extrema) in the estimated correlation, $\phi$, may be observed at values of $\lambda=\tau_i$. The time-offsets $\tau_i$ corresponding to these peaks in the correlation thus correspond to the distances to the anomalies, $d_i$, where $$d_i = \tau_i c/2. \quad (9)$$

Hence, in accordance with another embodiment of the present invention, determining a characteristic of the signal path may include determining a distance to an anomaly based on a time-offset corresponding to an extremum of the correlation. For example, the distance to the anomaly may be found by finding the peak of the correlation, finding the time-offset corresponding to the peak, and then multiplying the time offset by one-half the propagation velocity in the signal path.

The peak values of the correlation are a function of the reflection amplitudes, $\alpha_i$, which are a function of the impedance discontinuity at the anomaly. Larger impedance discontinuities generally result in larger reflections. Hence, in accordance with another embodiment of the present invention, determining a characteristic of the signal path may include determining an impedance of an anomaly based on an extremum of the correlation.

Alternately, in accordance with another embodiment of the present invention, the correlation may be estimated by estimating an autocorrelation of the operational signal.

Following the notation above, the operational signal will consist of the main portion of the operational signal f(t) and superimposed reflections r(t), and can be represented by $$x(t) = f(t) + r(t) = f(t) + \sum_{i=1}^{N} \alpha_i f(t - \tau_i). \quad (10)$$

This can be rewritten as $$x(t) = \sum_{i=0}^{N} \alpha_i f(t - \tau_i), \quad (11)$$

where, by definition, $\alpha_0=1$ and $\tau_i=0$.

The autocorrelation is then given by $$\phi(\lambda) = \int \sum_{i=0}^{N} \alpha_i f(t - \tau_i - \lambda) \sum_{j=0}^{N} \alpha_j f(t - \tau_j) dt. \quad (12)$$

By combining the sums, exchanging the order of integration and summation, and using equation (4), the autocorrelation is rewritten as $$\phi(\lambda) = \sum_{i=0}^{N} \sum_{j=0}^{N} \alpha_i \alpha_j \phi(\tau_i - \tau_j - \lambda). \quad (13)$$

The autocorrelation, $\phi(\lambda)$, will thus have a peak whenever $\lambda=\tau_i-\tau_j$. The autocorrelation may be estimated for a plurality of time-offsets in accordance with an embodiment of the present invention.

By limiting the time-offset, $\lambda$, to positive quantities, there are peaks corresponding to $\tau_i \geq \tau_j$. Hence, there will be a maximum number of peaks, $N_p$ of $$N_p = \frac{N}{2}(N+1) + 1. \quad (14)$$

including the peak at $\lambda=0$.

Based on the number of peaks observed, the number of anomalies may be estimated in accordance with another embodiment of the present invention. As noted above, the anomalies may correspond to faults (for example, short, open, partially shorted or partially open circuits) or may correspond to junctions, ends, or termination points of the signal path.

Table 1 demonstrates values of $N_p$ that are expected for various numbers of anomalies, N. For example, if one or two peaks are observed, the number of anomalies may correspondingly be estimated as zero or one. If more peaks are observed, the number of anomalies may be estimated from the Table 1. Some peaks may overlap, for example if $\tau_1-\tau_2=\tau_3-\tau_4$. In such a case a smaller number of peaks may be observed, and the number of anomalies may be estimated based on the value of N from Table 1 corresponding to the closest Np to that actually observed.

TABLE 1

| N | $N_p$ |
|---|---|
| 0 | 1 |
| 1 | 2 |
| 2 | 4 |
| 3 | 7 |
| 4 | 11 |
| 5 | 16 |
| 6 | 22 |
| 7 | 29 |
| 8 | 37 |
| 9 | 46 |
| 10 | 56 |

Further discussion of the nature of the observed peaks is illustrative. For $j=0$, $\tau_j=\tau_0=0$, the autocorrelation has a series of peaks at time-offsets corresponding to $\{\tau_i-\tau_0\}$ for $i=1 \ldots N$. These peaks correspond to the delays of the anomalies, similarly to the cross-correlation discussed above. For $j=1$, the autocorrelation has a series of peaks at time-offsets corresponding $\{\tau_i-\tau_1\}$ for $i=2 \ldots N$. This is the same pattern of peaks as for $j=0$, except with the first peak removed and all the others shifted by $\tau_1$. This pattern repeats, up to $j=N-1$, corresponding to a shift by $\tau_{(N-1)}$. This is similar to what physical chemists observe when studying the line spectrum of chemical elements due to the quantum jumps of electrons between different energy levels. Accordingly, in another embodiment of the invention, the delays corresponding to the anomalies may be determined by pattern matching the observed peaks of the autocorrelation to an expected distribution of peaks. Distances to the anomalies may be determined from the delays as discussed above.

Figure 3:
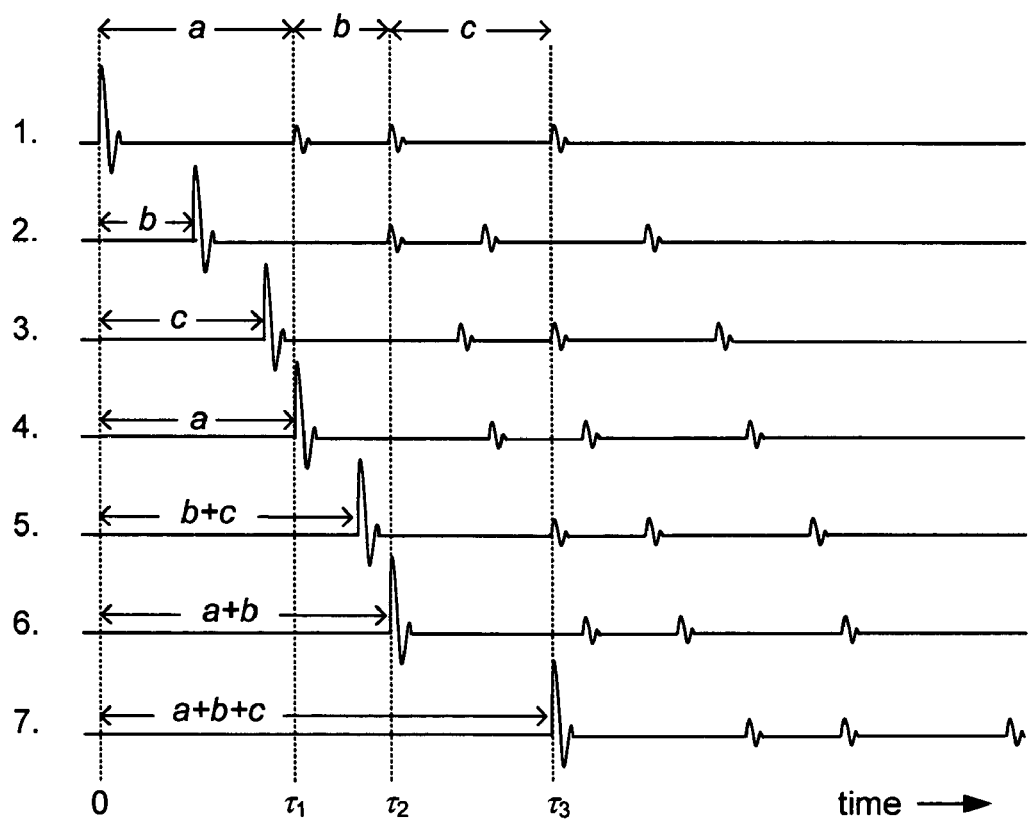
FIG. 3 is an illustration of the behavior of auto-correlation for a particular example.

The behavior of the auto-correlation is made clearer through the exemplary illustration of FIG. 3. FIG. 3 illustrates an example where there are three anomalies with corresponding delays of $\tau_1$, $\tau_2$, and $\tau_3$. The differences between the delays are $a=\tau_1-\tau_0$, $b=\tau_2-\tau_1$, and $c=\tau_3-\tau_2$. Recall that, by definition, $\tau_0=0$, corresponding to the main portion of the operational signal. The operational signal will thus include four components: the main portion (also referred to as the forward portion) and the reflected portion having three delayed copies of the main signal. These four components are designated $f_0$, $f_1$, $f_2$, and $f_3$ respectively in line A of FIG. 3. For clarity of illustration, the main portion of the operational signal and reflections have been illustrated as though they are short pulses, but it is to be understood that the operational signal is not limited to such a form. Many useful operational signals will have long duration in time, resulting in overlap between the main portion of the operational signal and the reflections.

Considering equation (12), line 1 of FIG. 3 corresponds to the second summation. When $\lambda=0$, the argument of f( ) in each of the sums is identical, and hence line 1 also also corresponds to the first summation term. Hence, for cases where $i=j$, the correlation will be its largest value. As $\lambda$ increases, the first summation is shifted to the right, as shown in lines 2 through 7 of FIG. 3. For $\lambda=b$, (line 2, FIG. 3) it can be seen that the $f_1$ component will line up with the $f_2$ component. Hence, a locally large (peak) correlation will be observed at this time-offset. Similarly, for time-offsets of c, a, b+c, a+b, and a+b+c (lines 3 through 7, FIG. 3) certain components will line up between the two sums, resulting in a locally large correlation. Hence, in general, peaks will be observed at a time-offset of zero (1 peak), time-offsets corresponding to the delays (N peaks), and time-offsets corresponding to the different intervals between pairs of delays (N(N−1)/2 peaks). Hence, there are a total of $N_p=1+N+N(N-1)/2=1+(N+1)N/2$ peaks as noted above in equation (14).

Figure 4:
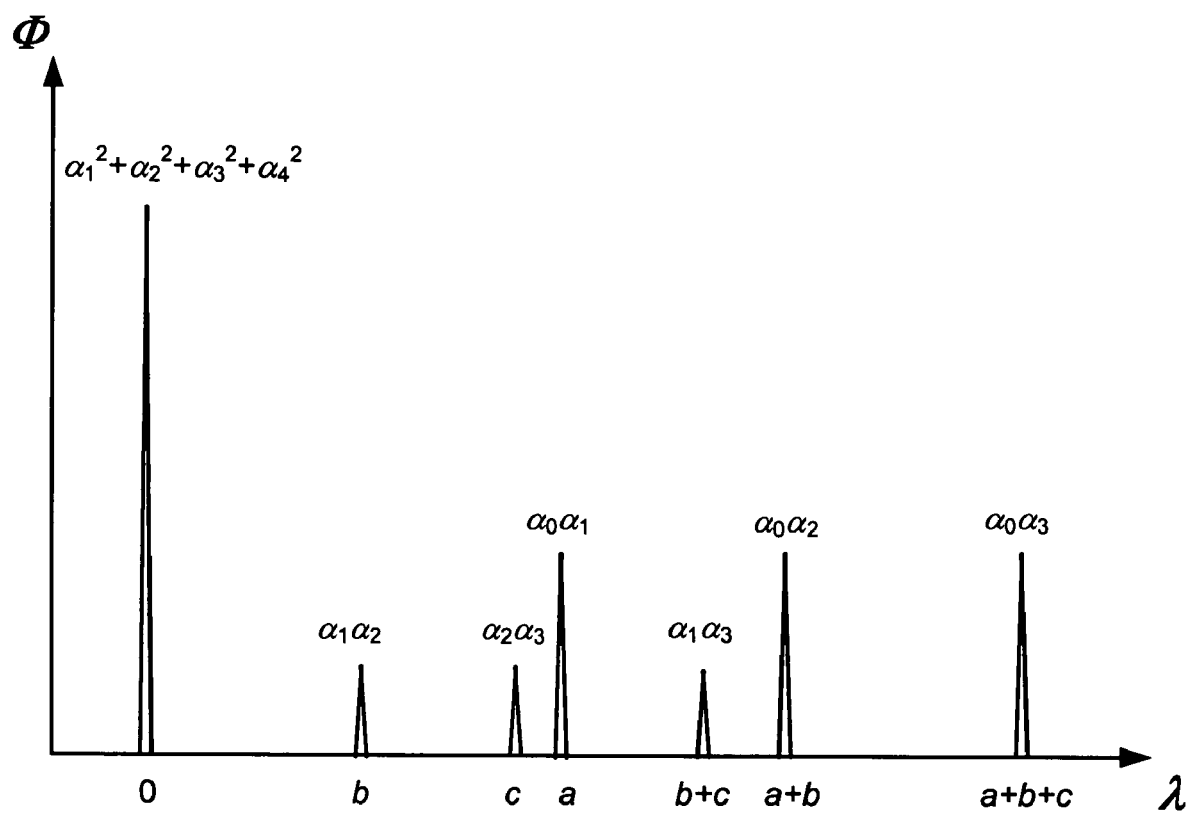
FIG. 4 is an illustration of an exemplary autocorrelation.

The resulting correlation for this example has 7 peaks as illustrated in FIG. 4. The peaks are labeled with the nominal amplitude that will be observed as well, from which the components that contribute to that peak can be seen. For example, the peak at a time-offset of b+c has an amplitude of $\alpha_1\alpha_3$, and corresponds to the alignment of the $f_1$ and $f_3$ components. Several observations can be made regarding the behavior of the autocorrelation when there are more than two peaks. First, the peak at the largest time-offset is at a time-offset corresponding to the sum of the delays. Second, the first two peaks correspond to time-offsets that are spaces between the delays. Third, the N−1 largest time-offsets are at time-offsets that are sums of the delays.

The performance of the method 100 may now be described. The correlation function and power spectral density of an operational signal are Fourier Transform pairs. Hence, the narrower the bandwidth of the operational signal, the wider the span of the autocorrelation. The resolution with which the location of an anomaly may be determined is a function of the span of the autocorrelation; wider spans provide less resolution. Hence, a wider bandwidth operational signal will have a narrower span of the autocorrelation, and thus higher resolution.

Accordingly, the method 100 may further include modifying the operational signal to improve a ratio of a nominal peak of the correlation result to a nominal sidelobe level of the correlation result. For example, modifying the operational signal may include adding a noise-like signal to the operational signal. Many techniques for generating noise-like signals with a high nominal peak to nominal sidelobe ratio are known. For example, binary pseudo-noise sequences, including Kasami and Gold codes are known to have high peak to nominal sidelobe ratios. A signal with a high peak to nominal sidelobe ratio is referred to as having good shift correlation properties. The noise-like signal may occupy the same frequency band as the operational signal (in which case the noise-like signal is preferably small relative to the operational signal) or the noise-like signal may occupy a different frequency band than the operational signal.

Figure 5:
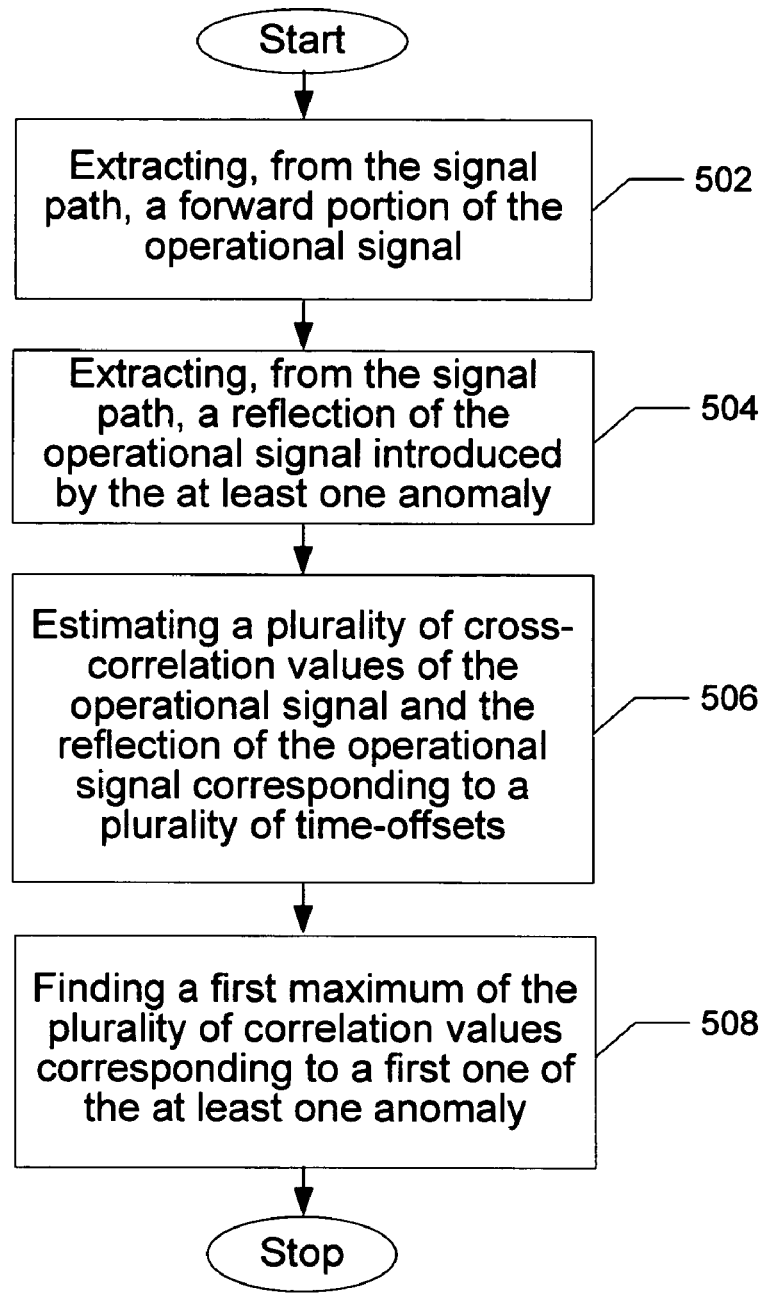
FIG. 5 is flow chart of a method of testing a signal path having at least one anomaly in accordance with another embodiment of the present invention.

Additional, more detailed embodiments of the present invention will now be described. FIG. 5 provides a flow chart of a method 500 of testing a signal path, having at least one anomaly, in accordance with another embodiment of the present invention. The method may include extracting 502, from the signal path, a forward portion of the operational signal. The method may further include extracting, from the signal path, a reflection 504 of the operational signal introduced by the at least one anomaly. For example, the forward portion of the operational signal may be generated by a component 206 (FIG. 2) of the operational system, propagating in a forward direction 208 down the signal path 202. The reflection is introduced by the at least one anomaly 204, and propagates in a reverse direction 212 down the signal path. Various techniques are known in the art for separately extracting signals propagating in different directions down a signal path and are to be considered within the scope of the present invention.

The method 500 may further include estimating 506 a plurality of cross-correlation values of the operational signal and the reflection of the operational signal corresponding to a plurality of time-offsets. Various techniques for estimating a cross-correlation are described herein and other techniques are known in the art, all of which are to be considered within the scope of the present invention.

The method 500 may further include finding 508 a first extremum of the plurality of cross-correlation values corresponding to a first one of the at least one anomaly. For example, the cross-correlation will have peaks at time-offsets corresponding to the delays associated with the propagation time from the observation point 214 to the anomaly and back (i.e., distance d in FIG. 2).

In accordance with another embodiment of the present invention, the method 500 may further include finding a second extremum of the plurality of correlation values corresponding to a second one of the at least one anomaly.

Figure 6:
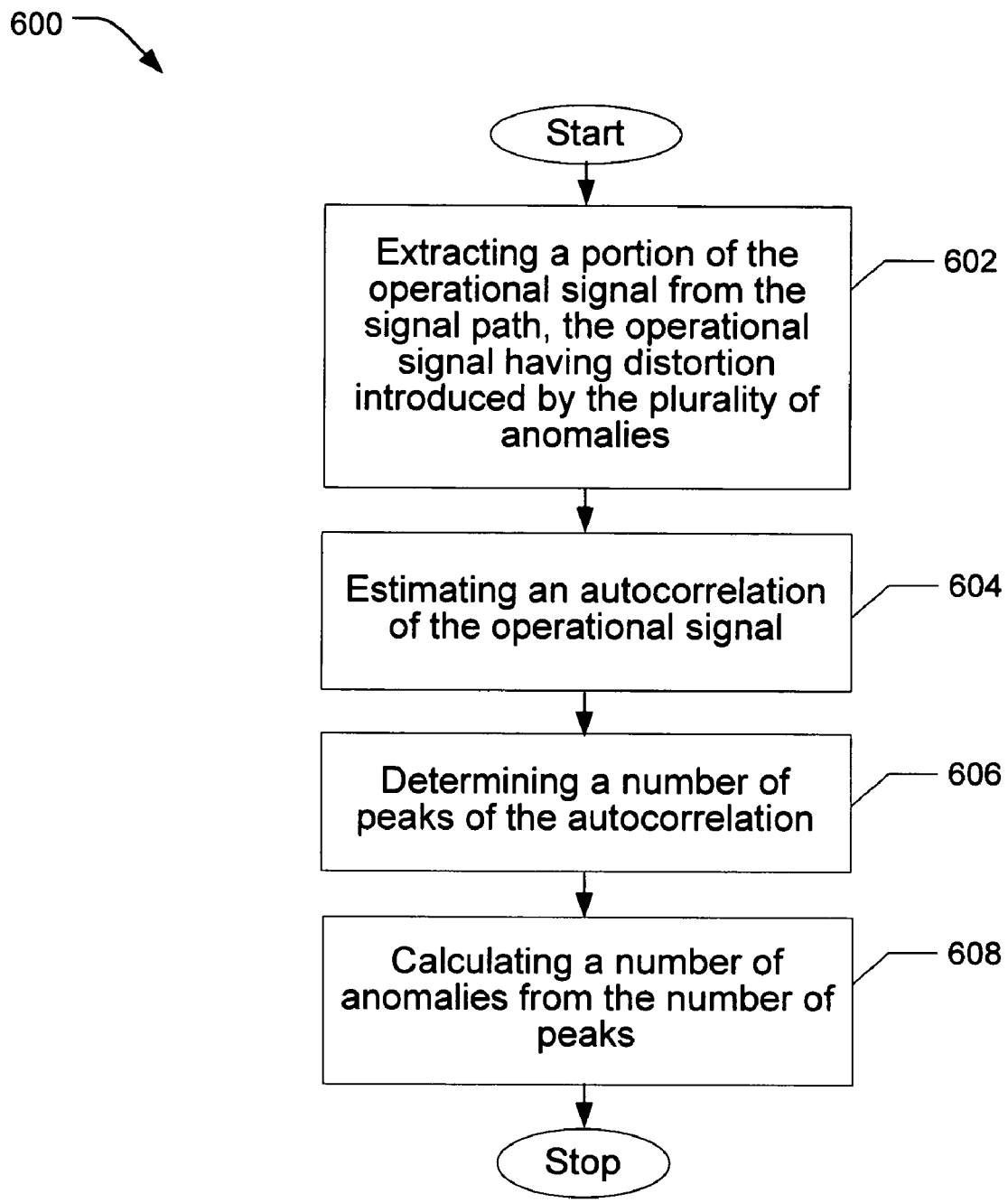
FIG. 6 is flow chart of a method of testing a signal path having a plurality of anomalies in accordance with another embodiment of the present invention.

FIG. 6 provides a flow chart of a method 600 of testing a signal path, having a plurality of anomalies, in accordance with another embodiment of the present invention. The method may include extracting 602 a portion of the operational signal from the signal path. The operational signal may have distortion introduced by the plurality of anomalies. For example, reflections of the forward portion of the operational signal introduced by the plurality of anomalies may be superimposed onto the forward portion of the operational signal, to produce the operational signal that is extracted from the signal path. The method may further include estimating 604 an autocorrelation of the operational signal. Various techniques for estimating an autocorrelation are described herein, and other techniques are known in the art, all of which are to be considered within the scope of the present invention.

The method 600 may further include determining 606 a number of peaks of the autocorrelation. For example, a threshold may be set based on the known nominal sidelobe level of the autocorrelation, and any point (or groups of points) at which the correlation is above the threshold declared a peak. Various other techniques for detecting a peak are known and are to be considered within the scope of the present invention.

The method 600 may further include calculating 608 a number of anomalies from the number of peaks. For example, the number of anomalies may be determined from the number of peaks by solving equation (14) or from Table 1 as discussed above. Various other ways of calculating the number of anomalies will occur to one skilled in the art and are to be considered within the scope of the present invention.

The method 600 may further include pattern-matching the autocorrelation with an expected distribution of peaks to determine a location of at least one of the plurality of anomalies. For example, from the location of the peaks, ranges of possible delays for the anomalies may be determined. The autocorrelation may then be compared to an expected distribution of peaks for various combinations of delays within the range of possible delays. Delays may be converted to distances along the signal path, and hence locations, as discussed above. Distances to anomalies may prove useful for fault finding or network mapping. In a first example, knowing the distance to an anomaly may allow the cause to be found and corrected by a technician. In a second example, mapping the topology of a network may be possible by using the distance to junctions and lengths of various branches in the signal path determined using the method.

Figure 7:
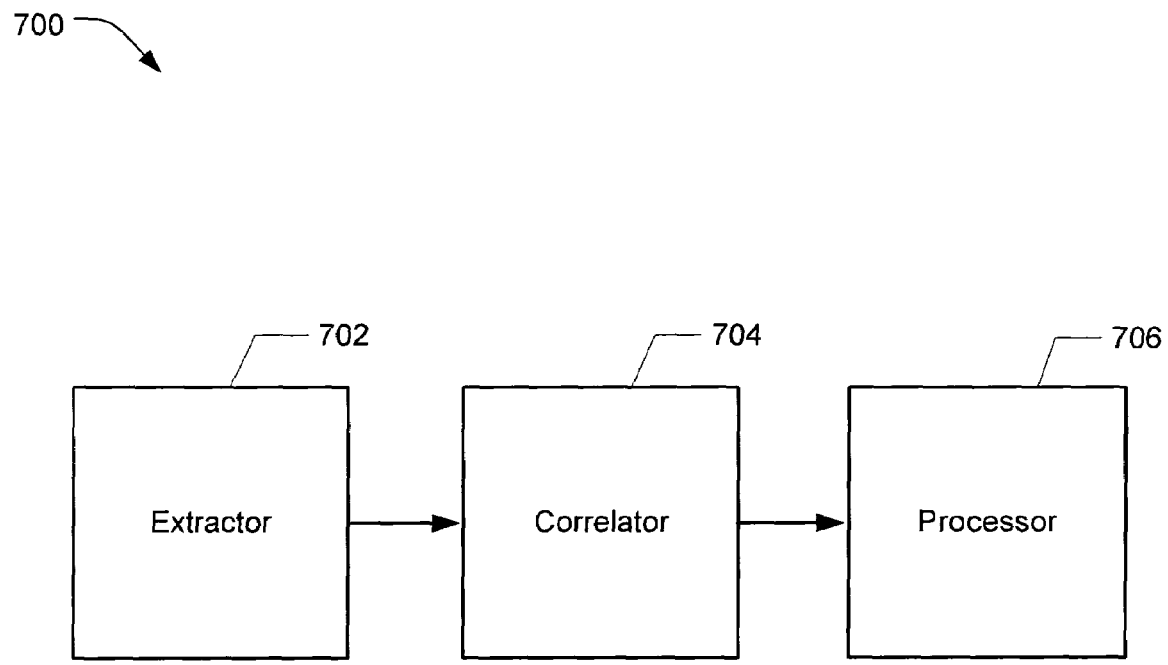
FIG. 7 is a block diagram of a system for testing a signal path having an operational signal in accordance with an embodiment of the present invention.

FIG. 7 illustrates a block diagram of system 700 for testing a signal path having an operational signal. The system may include an extractor 702 configured to extract a sample of the operational signal when coupled to a signal path. The system may further include a correlator 704 coupled to the extractor and configured to estimate a correlation of the sample of the operational signal. The system may further include a processor 706 coupled to the correlator and configured to determine a characteristic of the signal path from the correlation.

Various techniques for implementing the extractor 702 are known and to be considered within the scope of the present invention. For example, the extractor may be a wired connection to the signal path, a conductive probe that may be touched to the signal path, a capacitor, an inductor, or a directional coupler. Alternately, the extractor may be implemented using a hybrid or directional couplers to provide separation of the forward and reverse propagating portions of the operational signal.

Figure 17:
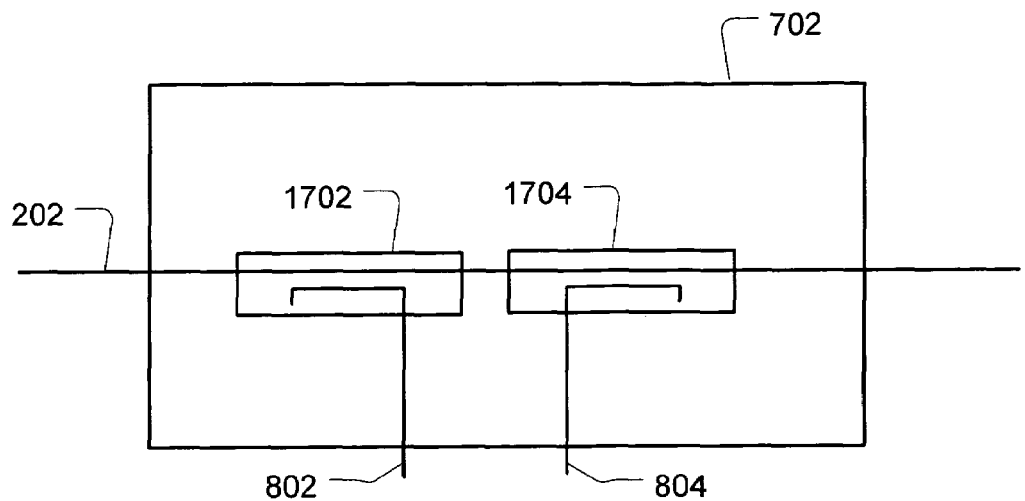
FIG. 17 is a detailed block diagram of an extractor in accordance with an embodiment of the present invention.

In accordance with another embodiment of the present invention, the extractor 702 may include a first 1702 directional coupler and a second directional coupler 1704 as illustrated in FIG. 17. The first directional coupler may be configured to extract a sample of a forward portion 802 of the operational signal, and the second directional coupler may be configured to extract a sample of a reflected portion of the operational signal 804.

Various implementations of the correlator 704 are known in the art and may be used consistent with embodiments of the present invention. For example, analog correlators may be used, including surface acoustic wave devices, and charge coupled device delay lines. Correlation may be performed using a multiplier or mixer in conjunction with an integrator or summer, as discussed within this disclosure. Leaky integrators or low pass filters may also be used to perform the summation. Alternately, various forms of digital correlators may be used. Digital correlators may be implemented in programmable logic devices, custom, or semi custom integrated circuits. One example is a serial sliding correlator. A sliding correlator sequentially tries each possible time-offset(over the range of time-offsets to be tested). Because a sliding correlator may take longer than desired to estimate the correlation, multiple correlators may be used in parallel to increase the speed. Hybrid (combined serial and parallel correlators arranged in a pipeline configuration) may also be used.

In accordance with another embodiment of the present invention, the correlator 704 may be further configured to estimate an auto-correlation of the operational signal.

In accordance with another embodiment of the present invention, the correlator may be further configured to estimate a cross-correlation of the forward portion of the operational signal and the reflected portion of the operational signal.

In accordance with another embodiment of the present invention, the correlator 704 may be configured to estimate the correlation at a plurality of time-offsets.

The processor 706 may be implemented in either hardware, software, or a combination of hardware and software. For example, the processor may include an indicator that indicates when the presence of an anomaly has been detected (e.g., based on a change in the correlation from a baseline). The processor may include hardware adapted to determine one or more characteristics of an anomaly within the signal path (e.g., location or impedance). The processor may include hardware and software adapted to determine the length or impedance of the signal path. Various alternative implementations of the processor will occur to one of skill in the art.

In accordance with another embodiment of the present invention, the system 700 may further include a media interface (e.g., 1514 in FIG. 15) coupled to the extractor and configured to modify an electrical property of the operational signal. The electrical property may be the frequency, voltage, current, or impedance.

The media interface may thus provide translation between the format of the operational system signals and a more convenient format for use by the correlator 702. For example, the media interface may include an analog to digital or digital to analog converter to provide translation between binary digital signals and analog signal format. The media interface may include a voltage divider or transformer to reduce a high voltage operational signal to a lower voltage more suitable for processing in the system. The media interface may include a mixer, downcoverter, or upconverter to provide translation in frequency, e.g. between high frequency operational signal and a low frequency sample of the operation signal used by the correlator. The media interface may include an impedance transformer. Further discussion of the media interface is provided below.

Figure 15:
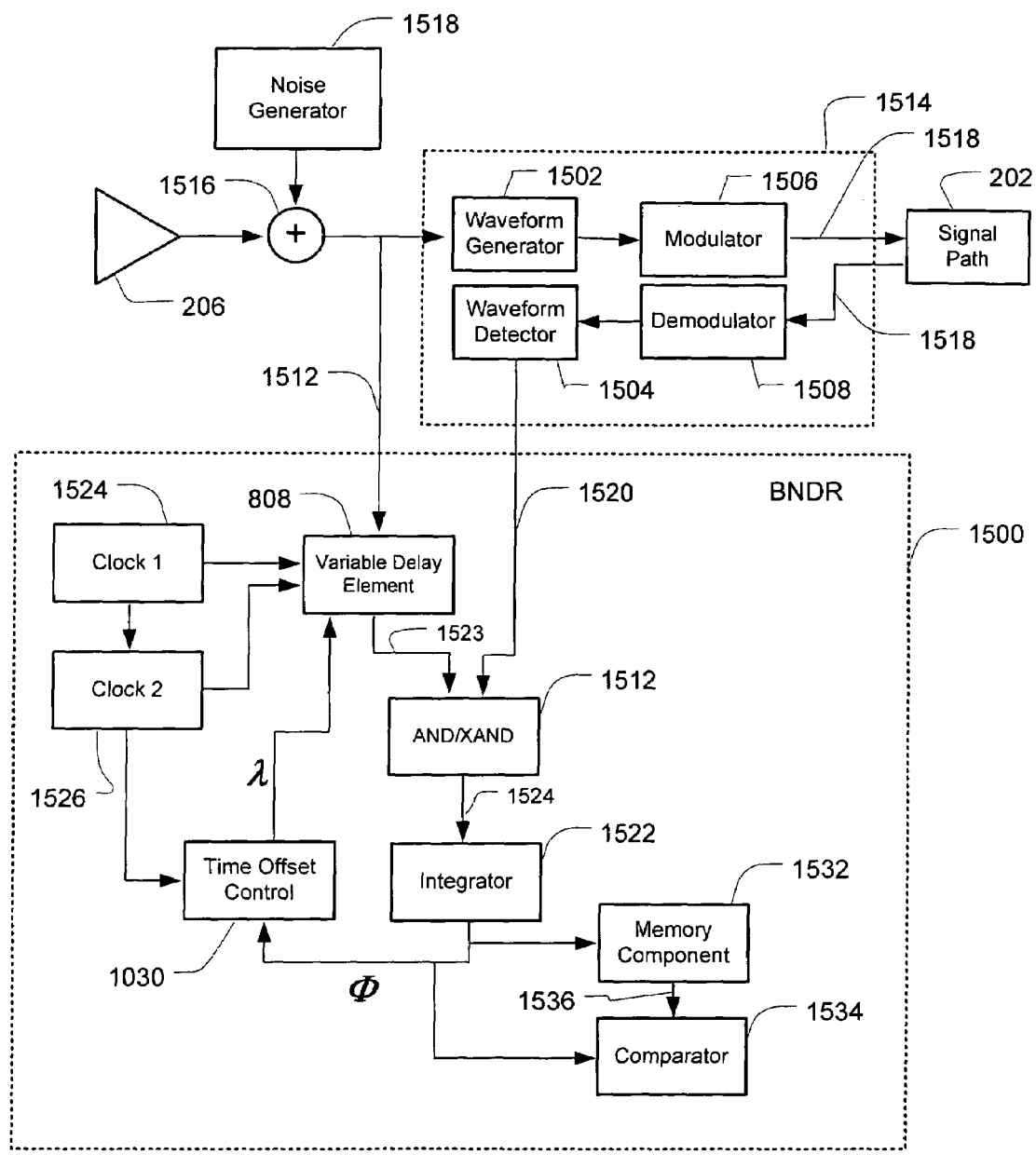
FIG. 15 is a detailed block diagram of a binary noise domain reflectometer (BNDR) in accordance with an embodiment of the present invention.

In accordance with another embodiment of the present invention, the system 700 may further include a memory component configured to store a baseline correlation (e.g., 1532 in FIG. 15). For example, the baseline correlation may be an ideal correlation expected for a properly configured signal path. The baseline correlation may be a correlation estimated and stored when the signal path is known to have no anomalies. The baseline correlation may be a correlation periodically estimated and stored during operation of the system, including for example by forming the average or median of several correlations.

The system may further include a comparator configured to compare the correlation to the baseline correlation (e.g., 1534 in FIG. 15).

Changes in the signal path can therefore be detected. For example, an anomaly may appear in the signal path due to a frayed or short circuit. The anomaly results in additional reflections, which in turn result in additional correlation peaks, which may be detected by the system.

Comparisons of the signal path to a desired configuration may be performed. For example, a baseline correlation may be stored for a desired configuration of the signal path, and then the actual configuration checked against this ideal by comparing the correlation to the baseline correlation. Adjustments of the signal path (e.g. trimming wire lengths, adjusting termination impedance, etc.) may then be performed.

Figure 8:
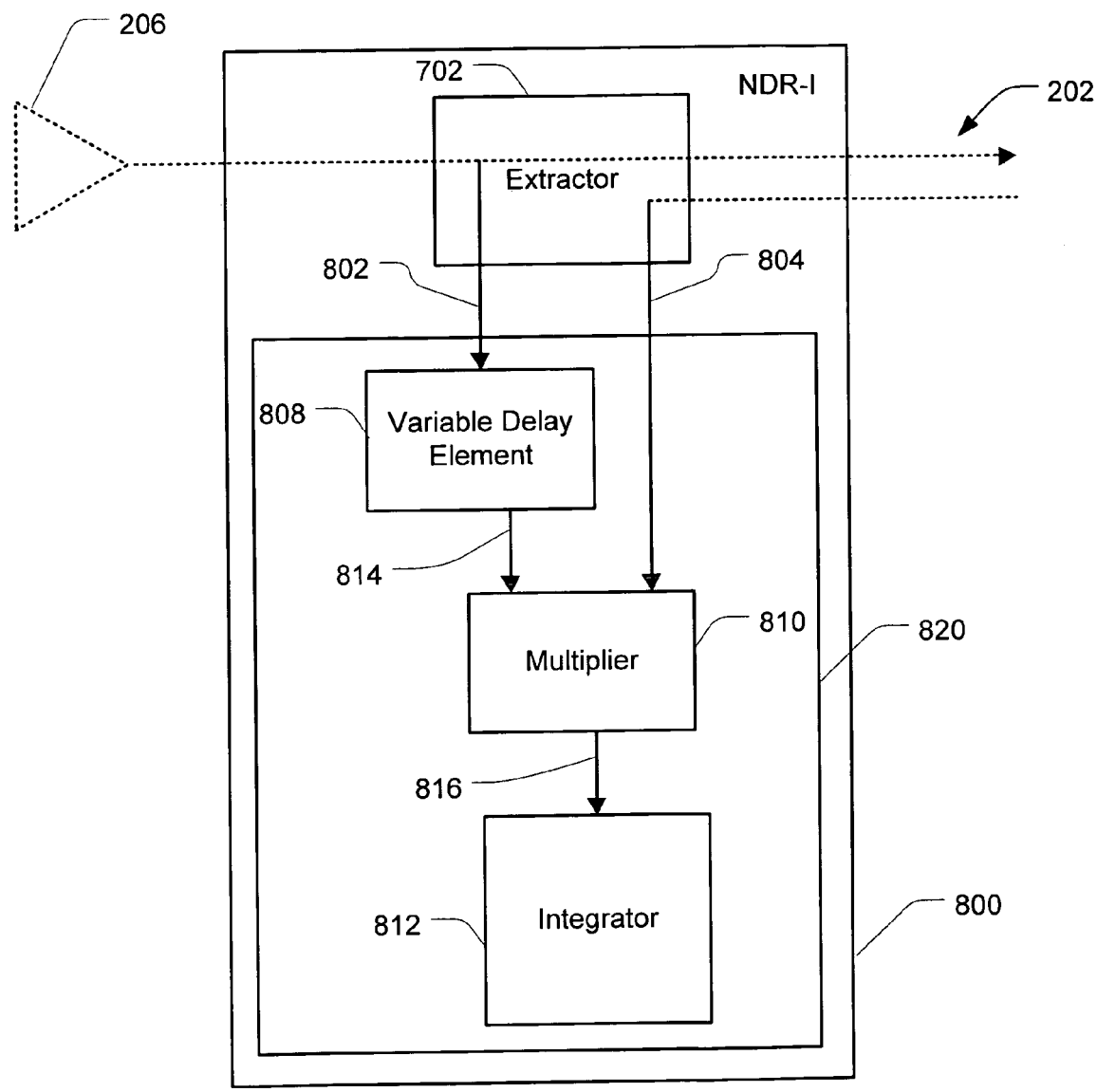
FIG. 8 is detailed block diagram of a noise domain reflectometer type I(NDR-I) system for testing a signal path in accordance with an embodiment of the present invention.

A detailed implementation of a system for testing a signal path in accordance with an embodiment of the present invention is illustrated in the block diagram of FIG. 8. This configuration is referred to as a noise domain reflectometer type I (NDR-I). The NDR-I 800 may include a cross-correlator 820. The NDR-I may also include an extractor 702 configured to extract a forward sample 802 of a forward portion of an operational signal present in the signal path 202 and configured to extract a reflected sample 804 of a reflected portion of the operational signal.

The cross-correlator 820 may include a variable delay element 808, coupled to the extractor 702, and configured to introduce a variable time delay to produce a delayed sample of the operational signal 814. The cross-correlator may further include a multiplier 810 coupled to the variable delay element and coupled to the extractor. The multiplier may be configured to multiply the delayed sample by the reflected sample 804 and output a multiplication product 816. The cross-correlator 820 may further include an integrator 812 coupled to the multiplier and configured to integrate the multiplication product to form the correlation.

The forward portion of the operational signal may be input into the signal path by an operational system component 206. A reflected portion of the operational signal is reflected back towards the component by anomalies in the signal path. The delay of the reflected portion of the operational signal relative to the forward portion of the operational signal is related to the round trip distance to the anomaly. The correlation will be large when the variable delay 808 has been set to correspond to this round trip delay. When the variable delay is set to other values, the correlation will generally be smaller. For operational signals with good shift correlation properties, a significant difference may be observed between the peak correlation observed when the variable delay has been set to correspond to the round trip delay of the anomaly and the correlation observed for other variable delay settings.

Note that, if no reflection is present in the signal path, the reflected portion is not present, and hence is simply zero. The correlation will therefore have no large peaks. This situation may also be detected.

Figure 9:
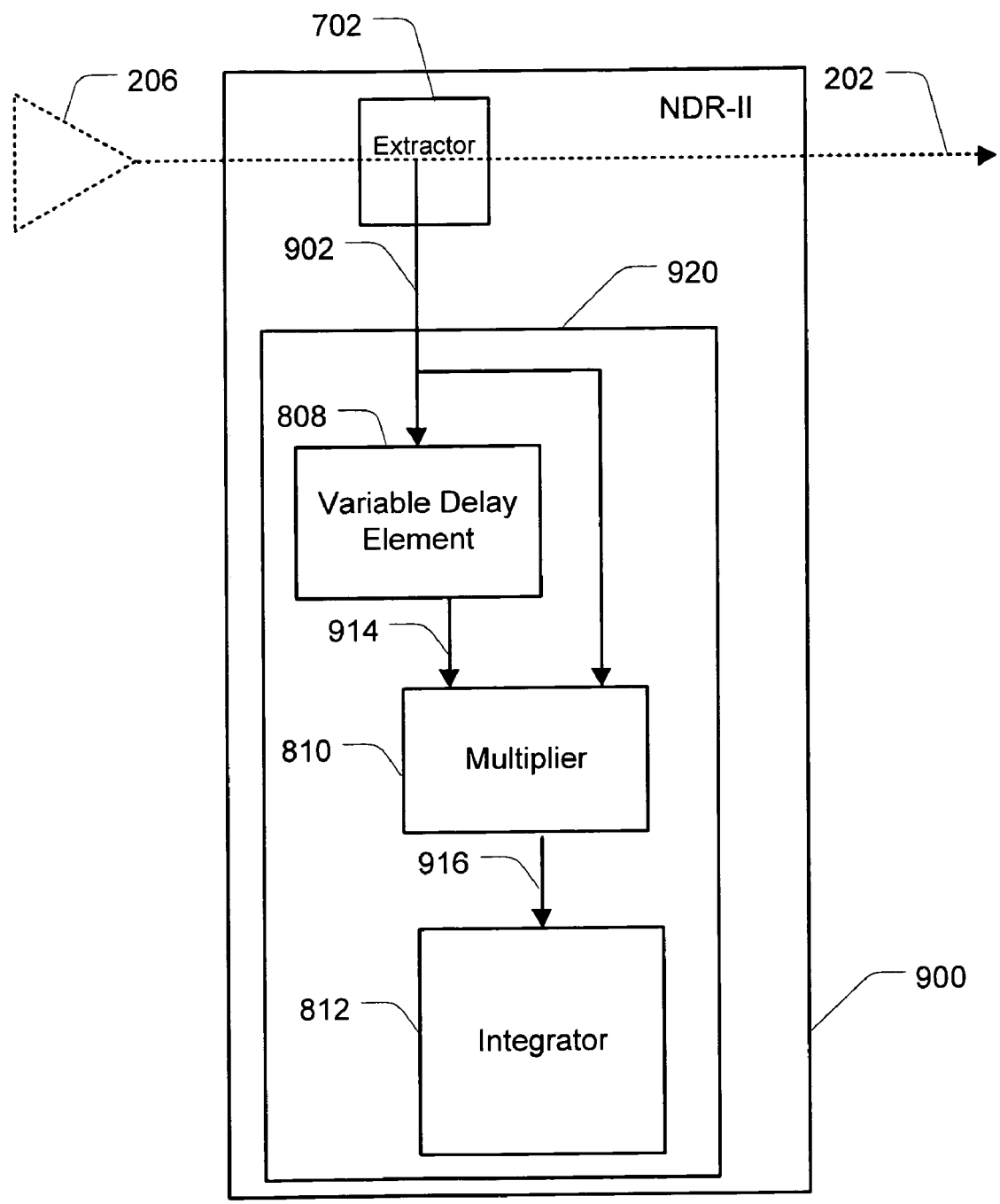
FIG. 9 is detailed block diagram of a noise domain reflectometer type II (NDR-II) system for testing a signal path in accordance with an embodiment of the present invention.

A detailed implementation of another system for testing a signal path in accordance with an embodiment of the present invention is illustrated in block diagram in FIG. 9. This configuration is referred to as a noise domain reflectometer type II (NDR-II). The NDR-II 900 may include an auto-correlator 920. The NDR-II may also include an extractor 702 configured to extract a sample 902 of the operational signal present in the signal path 202.

The auto-correlator 920 may include a variable delay variable delay element 808, coupled to the extractor 702, and configured to introduce a variable time delay to produce a delayed sample of the operational signal 914. The auto-correlator may further include a multiplier 810 coupled to the variable delay element and coupled to the extractor. The multiplier may be configured to multiply the sample of the operational signal 902 by the delayed sample 914 and output a multiplication product 916. The auto-correlator 920 may further include an integrator 812 coupled to the multiplier and configured to integrate the multiplication product to form the correlation.

Because the NDR-II 900 only requires a single connection to the signal path 202, integration and/or use of the NDR-II may prove simpler than an NDR-I.

Operation of the NDR-II is similar to the NDR-I just described, with the following minor differences. A forward portion and a reflected portion of the operational signal will combine (superimpose) to create the operational signal observed at the extractor 702. The correlation will be large when the variable delay 808 is set equal to a delay value corresponding to a round-trip distance to an anomaly in the signal path (and zero). When multiple anomalies are present in the signal path, the correlation value will also be large when the variable delay has been set equal to a delay value corresponding to the delay difference between different discontinuities. Hence, a series of correlation peaks will result from each discontinuity. These series of peaks may be interpreted as discussed above to determine the delay values corresponding to the anomalies in the signal path.

Many techniques for implementation of the correlator 702 (FIG. 7), cross-correlator 802 (FIG. 8), and autocorrelator 920 (FIG. 9) are known and to be considered within the scope of the present invention. For example, multiplication may be performed by mixers, analog multipliers, and digital logic gates. Integration and summation may be performed by analog integrators, low pass filters, digital integrators, and digital counters. Various correlator implementations are available as off the shelf components.

When the operational signal is a binary digital signal, greater simplification and cost reduction may be achieved by using digital components to implement the correlator 702 (FIG. 7), cross-correlator 802 (FIG. 8), or autocorrelator 920 (FIG. 9). Hence, in accordance with another embodiment of the present invention, the variable delay 808 (FIG. 8, 9) may implemented by a memory or other digital storage. In accordance with another embodiment of the present invention, the multiplier 810 (FIG. 8,9) may be implemented by an XOR, XAND, AND, or NAND logical gate. As will occur to one of skill in the art, the choice of binary multiplication method depends on the nature of the operational signal. In accordance with yet another embodiment of the present invention, the integrator 812 (FIG. 8, 9) may be implemented using a digital counter.

Figure 10:
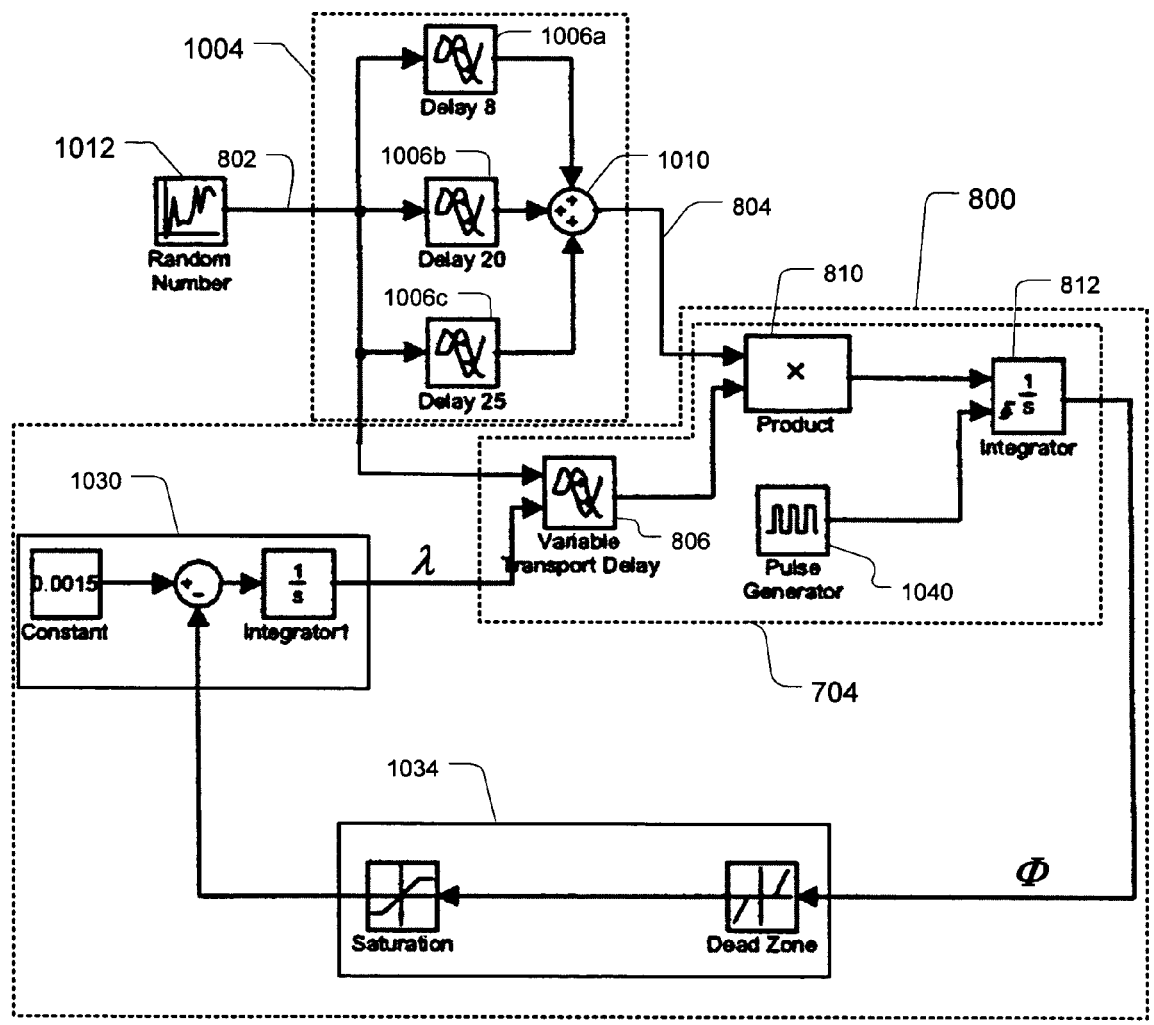
FIG. 10 is a simulation of an exemplary embodiment of an NDR-I in accordance with an embodiment of the present invention.

A simulation of an exemplary embodiment of an NDR-I 800 is shown in block diagram form in FIG. 10. The operational signal is simulated by a random number generator 1012, which produces the forward portion of the operational signal 802. A simulated signal path 1004 having three anomalies is created by three delayed copies of the operational signal with three delay blocks 1006, and a sum 1010 to create the reflected portion 1016 of the operational signal. Anomalies with delays of 8, 20, and 25 are simulated.

Within the NDR-I 800, the forward portion of the operational signal 802 (FIG. 8) and reflected portion of the operational signal 804 are fed to a correlator 704, configured to estimate the cross-correlation. The correlator includes a variable transport delay 808, multiplier (product) 810, and integrator 812. The variable transport delay produces a delayed sample of the forward portion of the operational signal delayed by the time-offset, λ. The multiplier multiplies the delayed sample of the forward portion of the operational signal by the reflected portion of the operational signal; the resulting product is then integrated. The correlation, φ, produced by the integrator is fed back through a rate control 1034 to a time-offset generator 1030. The integrator is periodically reset to zero by the pulse generator 1040.

Figure 11:
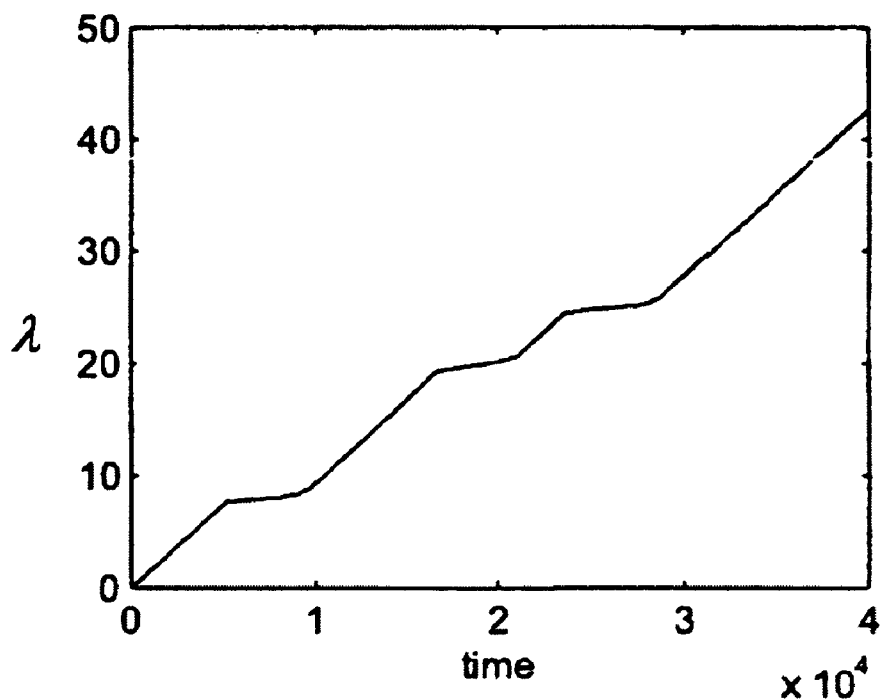
FIG. 11 is a plot of the time-offset for the simulation of FIG. 10.
Figure 12:
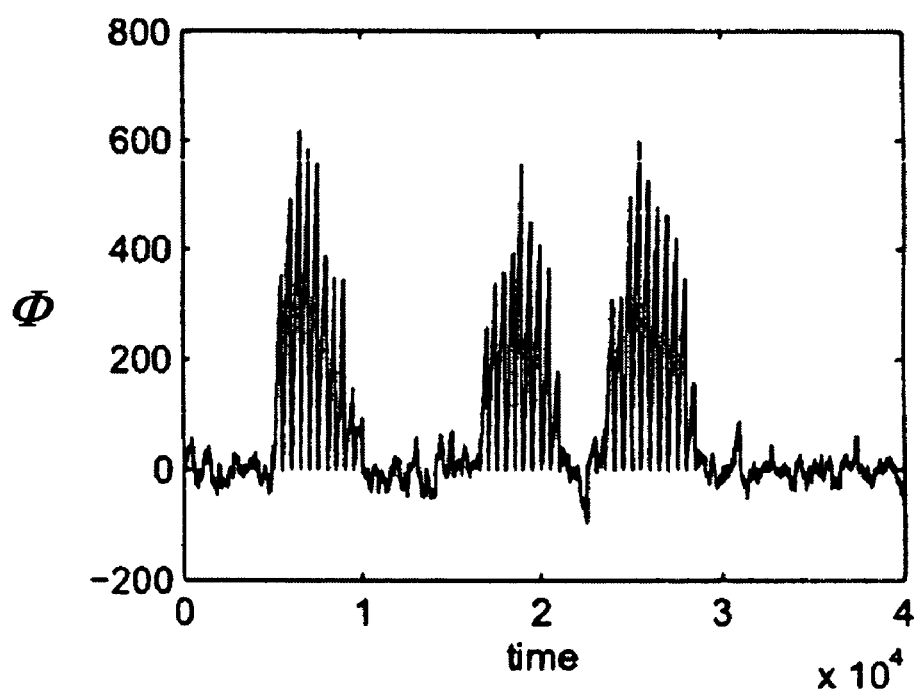
FIG. 12 is a plot of the correlation for the simulation of FIG. 10.

The time-offset, λ, is generated by the time-offset control 1030. The time-offset control produces a time-offset starting from a minimum time-offset and steadily increasing to a maximum time-offset, corresponding to a range of delays to be searched for anomalies in the simulated signal path 1004. In this simulation, the time-offset varies from 0 to 42 as a function of time, as illustrated in FIG. 11. The resulting correlation is shown in FIG. 12. Because the correlation increases when the time-offset is approximately equal to the round trip delay corresponding to an anomaly, the feedback through the rate control 1034 causes the rate at which the time-offset is varied to be reduced. Hence, the delays corresponding to anomalies in the signal path may be found by observing the lower slope regions in FIG. 11. Additionally, by slowing down the rate at which the time-offset is varied, improved accuracy in determining the delay (and hence distance and location) of the anomaly may be obtained. For example, in FIG. 11 it can be seen that the time-offset increases slowly (has a lower slope) in the vicinity of 8, 20, and 25, corresponding to the actual delays of the three anomalies in the simulated signal path.

Various other arrangements of an NDR-I will occur to one of skill in the art and are to be considered within the scope of the present invention. For example, the integrator 812 need not be periodically reset by the pulse generator 1040. In such an alternative arrangement, large correlation values may be detected by observing rapid increases in the correlation. In an alternate example, the rate control 1034 may be eliminated so that the time offset steadily increases from the minimum to maximum value.

Figure 13:
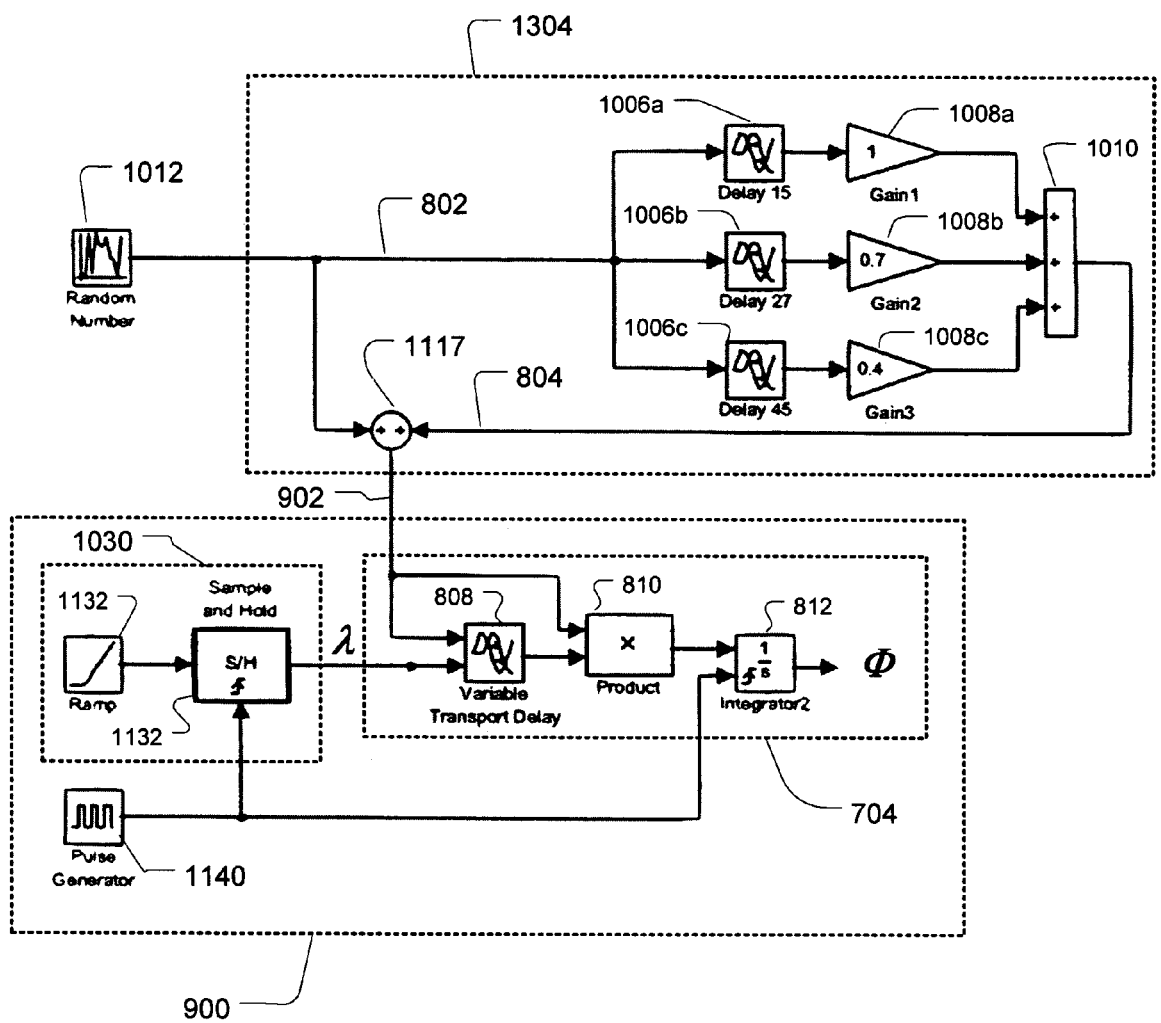
FIG. 13 is a simulation of an exemplary embodiment of an NDR-II in accordance with an embodiment of the present invention.

A simulation of an exemplary embodiment of an NDR-II 900 is shown in block diagram form in FIG. 13. The operational signal is simulated by a random number generator 1012, which produces the forward portion of the operational signal 802. A simulated signal path 1304 having three anomalies is simulated by creating three delayed copies of the operational signal using three delay blocks 1006, amplification blocks 1008, and a sum 1010 to create the reflected portion 804 of the operational signal. Anomalies with delays of 15, 27, and 45 are simulated. The forward and reflected portion of the operational signal are summed to generate the operational signal 902, which has distortion caused by the superposition of reflections from the signal path.

Within the NDR-II 900, the operational signal 902 is fed to a correlator 704 configured to estimate the autocorrelation of the operational signal. The autocorrelator includes a variable transport delay 808, multiplier 810, and integrator 812. The amount of delay in the variable transport delay is controlled by a time-offset control 1030. The time-offset control includes a ramp generator 1332 and a sample and hold 1334. A pulse generator 1340 determines the steps at which the time-offset is varied, holding a particular time-offset λ, while the correlation is estimated, and resetting the integrator between time-offset steps.

Figure 14:
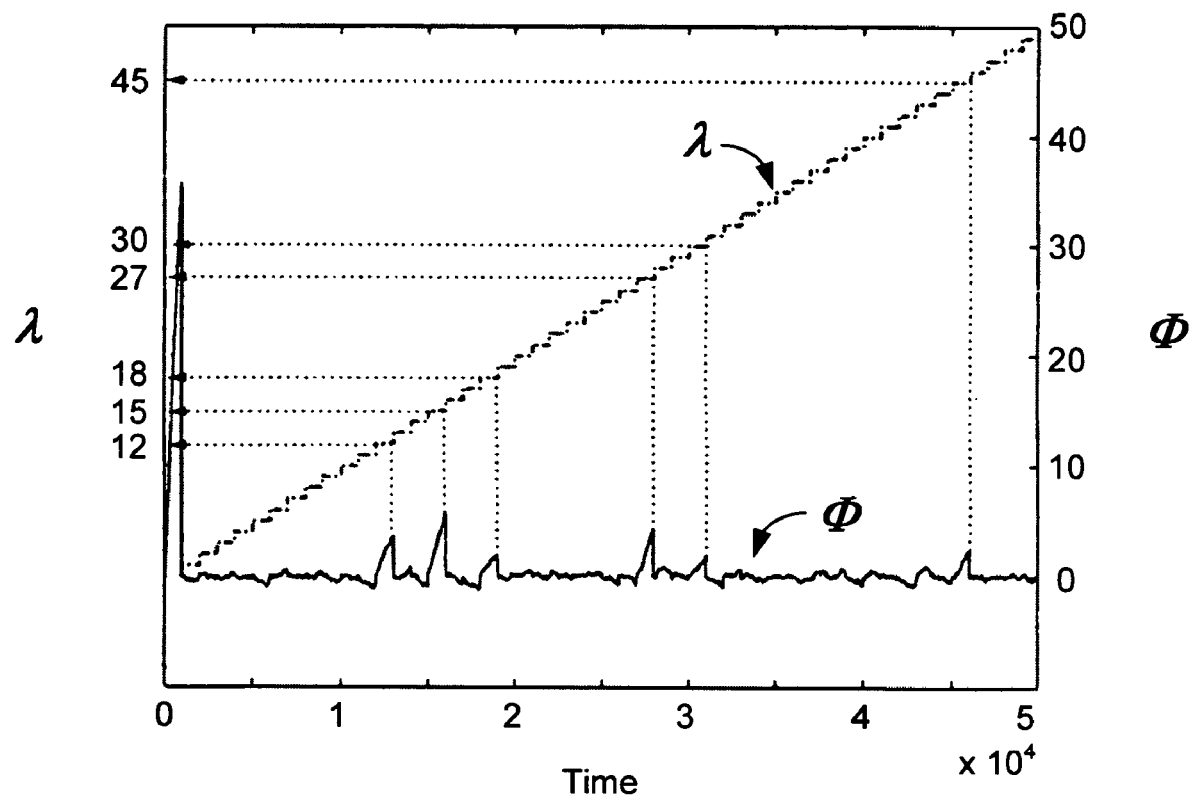
FIG. 14 is a plot if the time-offset and correlation for the simulation of FIG. 13.

FIG. 14 plots the time-offset, λ, output from the time-offset control 1330 and the autocorrelation, φ, estimated by the correlator 704. The simulated signal path 1304 has N=3 simulated anomalies with delays of 15, 27, and 45. Hence, as predicted by equation (14), we observe $N_p$=7 peaks in the correlation. Since the intervals between the delays are 15, 12, and 18, we observe peaks in the correlation at time-offsets of 0, 12, 15, 18, 15+12=27, 12+18=30, and 15+12+18=45.

Determining the distance to the anomalies will now be illustrated for this example. Since $N_p$=7 peaks are present, it is known there are N=3 anomalies. We define the delays of the anomalies as $f_1$, $f_2$, and $f_3$. We define a, b, c to be the intervals between 0, $f_1$, $f_2$, and $f_3$, respectively. The peak at the time-offset of λ=45 corresponds to the maximum delay, and is this equal to $f_3$. Hence, we also know that $$a+b+c=45. \tag{15}$$

We also know that the first two peaks after a time-offset of zero correspond to time-offsets equal to intervals between the delays. Hence we know that two of {a,b,c} are equal to {12, 15}. The third interval must therefore be 45−12−15=18. Hence, the intervals are $$a,b,c \in \{12,15,18\}. \tag{16}$$

It remains to determine the order of the intervals. We also know that the peak at the second largest time-offset of 30 must correspond to the sum of two intervals, hence $$\max\{a+b, b+c\}=30. \tag{17}$$

Finally, the peak at the time-offset of 27 must also be the sum of two intervals, hence $$\min\{a+b, b+c\}=27. \tag{18}$$

There are 6 possible arrangements for a,b, and c. Two of these arrangements satisfy both equation (17) and equation (18): a,b,c=15, 12, 18 and a,b,c=18, 12, 15. This corresponds to delays of $f_1$, $f_2$=15, 27 and $f_1$, $f_2$=18, 30. Hence, although the delay of one anomaly, $f_3$, was found (and hence the location may be found by determining the distance corresponding to this delay as discussed above), without additional information, the result is ambiguous.

The peak values of the correlation may be used to resolve this ambiguity. Designating the peak values of the correlation at the delays $I_\lambda$, then from equation (13) we can find the expected peak values of the correlation for each of the two possible arrangements. Table 2 illustrates the actual correlation measurement from FIG. 14 and the expected correlation result for both arrangements where $\alpha_0$=1 as defined previously.

TABLE 2

| λ | $I_\lambda$ | $f_1, f_2$ = 15, 27 | $f_1, f_2$ = 18, 30 |
|---|---|---|---|
| 12 | 0.70 | $\alpha_1\alpha_2$ | $\alpha_1\alpha_2$ |
| 15 | 1.00 | $\alpha_1$ | $\alpha_2\alpha_3$ |
| 18 | 0.28 | $\alpha_2\alpha_3$ | $\alpha_1$ |
| 27 | 0.70 | $\alpha_2$ | $\alpha_1\alpha_3$ |
| 30 | 0.40 | $\alpha_1\alpha_3$ | $\alpha_2$ |
| 45 | 0.40 | $\alpha_3$ | $\alpha_3$ |

For these results, it has been assumed the peak autocorrelation of the forward portion of the operational signal is 1. This assumption is not essential, since the peaks of the correlation scale similarly for other peak autocorrelation values as will be apparent to one skilled in the art.

For either arrangement, we therefore know $\alpha_3$=$I_{45}$, and from FIG. 14, $I_{45}$=0.40. The ambiguity may be resolved by plugging this value for $\alpha_3$ into Table 2. Doing so gives contradictory results for the arrangement $f_1$, $f_2$=18, 30 and consistent results for the arrangement $f_1$, $f_2$=15, 27. Hence, the first two delays are now known: $f_1$=15, $f_2$=27.

Depending on the characteristic of the operational signal, the accuracy with which the correlation peaks will relate to the reflection amplitudes may vary. Hence, it may prove beneficial to average a number of estimates of the correlation.

A detailed implementation of a binary noise domain reflectometer (BNDR) in accordance with an embodiment of the present invention is illustrated in FIG. 15. The BNDR, shown generally at 1500, receives an operational signal from an operational signal component 206. Preferably, the operational signal is noise-like in that it has an unpredictable aspect; this unpredictability results in the operational signal being shift uncorrelated. If the operational signal is not shift uncorrelated, or has high correlation sidelobes, the operational signal may be modified by adding a noise-like signal. This noise-like signal may be selected to have good shift correlation properties. This noise-like signal may be superimposed on the operational signal while causing minimal interference to the system by limiting the amplitude of the noise-like signal to be less than the operating noise margin of the operational system or by placing the noise-like signal in a frequency band not used by the operational signal. For example, a noise-generator 1518 may generate a noise-like signal which is added using a summer 1516 to the operational signal. The summer may be included as part of the extractor which extracts a sample of the operational signal from the signal path. Various other techniques for superimposing the noise-like signal on the operational signal will occur to one of skill in the art having possession of this disclosure.

Inclusion of the noise-like signal may also prove beneficial for testing when no operational signal is present. In such a case, the noise-like signal may be injected into the signal path.

Although this noise-like signal can take on a variety of forms, if a binary digital noise-like signal is chosen, all of the previously discussed benefits of a simple digital implementation are realized. For example, a noise-like signal may be generated using PN codes as discussed above.

The operational signal may be an intermediate signal within the operational system that is translated, e.g. through a media interface 1514, before being applied to the signal path. For example, translation may be accomplished by converting from digital data to a waveform (and vice versa) using a waveform generator 1502 and waveform detector 1504, and further translating to (and from) a radio frequency using a modulator 1506 and demodulator 1508. The media interface thus provides a forward translated operational signal 1516 to the signal path, and receives a reflected translated operational signal 1518 from the signal path. The reflected translated operational signal is translated to the reflected signal 1520 provided to the BNDR.

The BNDR 1500 accepts the operational signal 1516 (and if present, the superimposed noise-like signal 1512), and accepts the reflected signal 1520. The operational signal 1512 is fed to a variable delay element 808 to produce a delayed version of the operational signal 1523. The delayed version of the operational signal is fed to an AND/XAND gate 1512. The reflected signal 1520 is fed to a second input of the AND/XAND gate. The AND/XAND gate functions as a binary multiplier, the result of which is output 1524. The output is fed to the analog integrator 1522.

Clock 1 1524 and clock 2 1526 provide overall control of the BNDR 1500. Clock 1 provides the basic sample timing for the BNDR and clocks multiple times for each time-offset under test. Clock 2 is a multiple of clock 1 and provides the increment of the time-offset, increasing the time-offset each time it clocks. Clock 2 also resets the integrator 1522 and loads the new time-offset into the variable delay element 808.

Although this illustration of the BNDR 1500 has assumed that a separate forward portion and reflected portion of the operational signal are provided, the BNDR may be implemented when the forward and reflected portion are superimposed using the principles of the NDR-II described above. The details for implementing such an arrangement, given this disclosure, are within the knowledge of one of ordinary skill in the art and therefore will not be further elaborated on herein.

Figure 16:
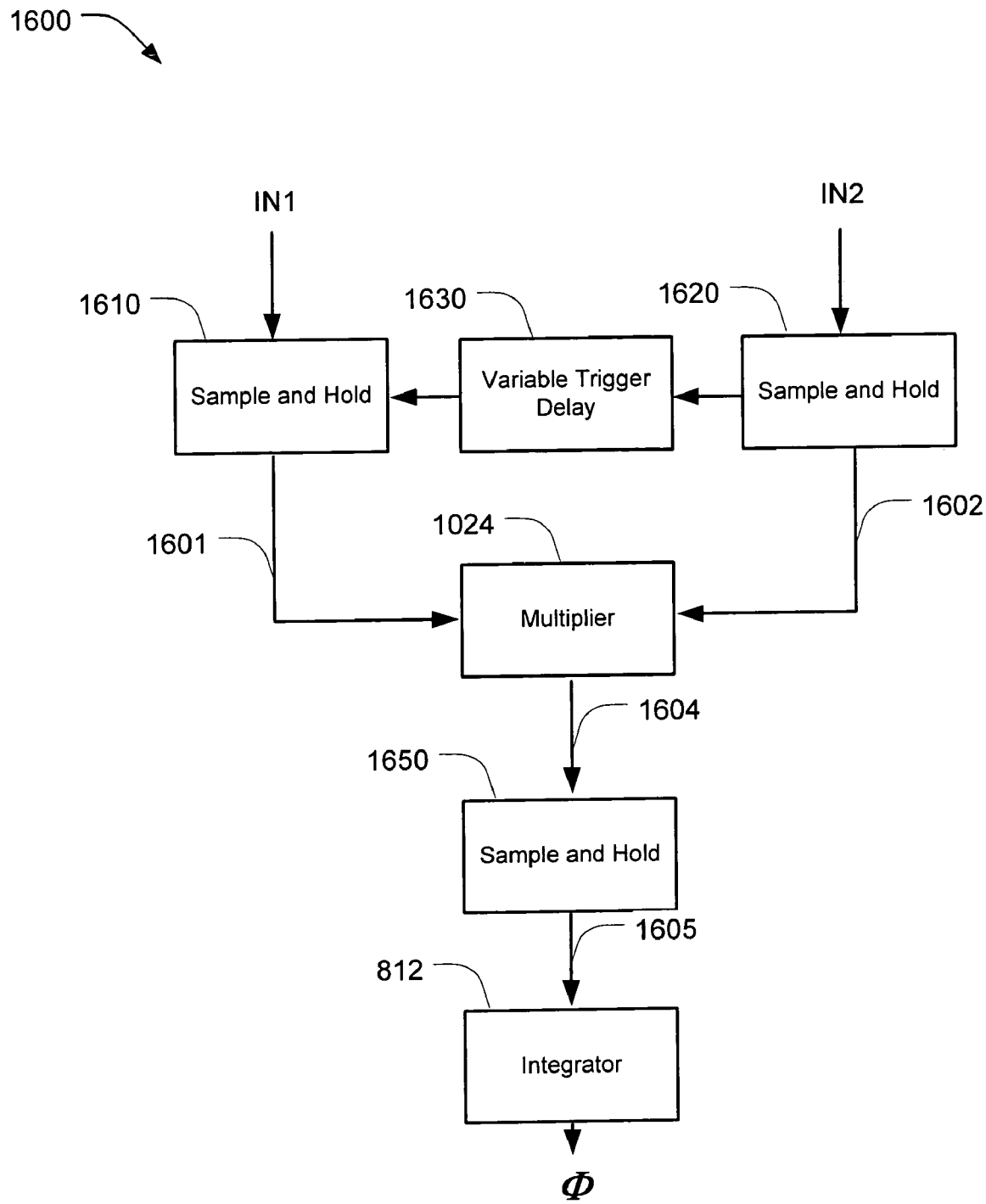
FIG. 16 is a block diagram of a two-point correlator in accordance with an embodiment of the present invention.

A particular implementation of a correlator known as a two-point correlator will now be discussed. A block diagram of a two-point correlator 1600, in accordance with an embodiment of the present invention, is illustrated in FIG. 16. The two-point correlator may be used to estimate either an autocorrelation or cross-correlation. For autocorrelation, IN1 and IN2 are connected to the extractor so that a sample of the operational signal is received (e.g., in an NDR-I configuration, FIG. 8). For cross-correlation, IN1 and IN2 are connected to the extractor so that a portion of the forward portion of the operational signal is received by IN1 and a portion of the reflected portion of the operational signal is received by IN2 (e.g., in an NDR-II configuration, FIG. 9).

The two-point correlator 1600 may include a first sample and hold 1610 connected in IN1. The two-point correlator may further include a second sample and hold 1620 connected to IN2. The two-point correlator may further include a variable trigger delay 1630 connected between the first and second sample and hold and configured to cause the first sample and hold to be triggered to sample with time-offset, $\lambda$, relative to the second sample and hold. The two-point correlator may further include a multiplier 1024 connected to the first and second sample and hold and configured to form a product 1604 of the samples 1601, 1602 from the first and second sample and hold. The two-point correlator may further include a third sample and hold 1650 configured to sample the product 1604 when the product is stable to produce a held product 1605. The two-point correlator may further include an integrator 812 configured to accept and integrate the held product 1605 to form the estimated correlation, $\phi$.

Figure 18:
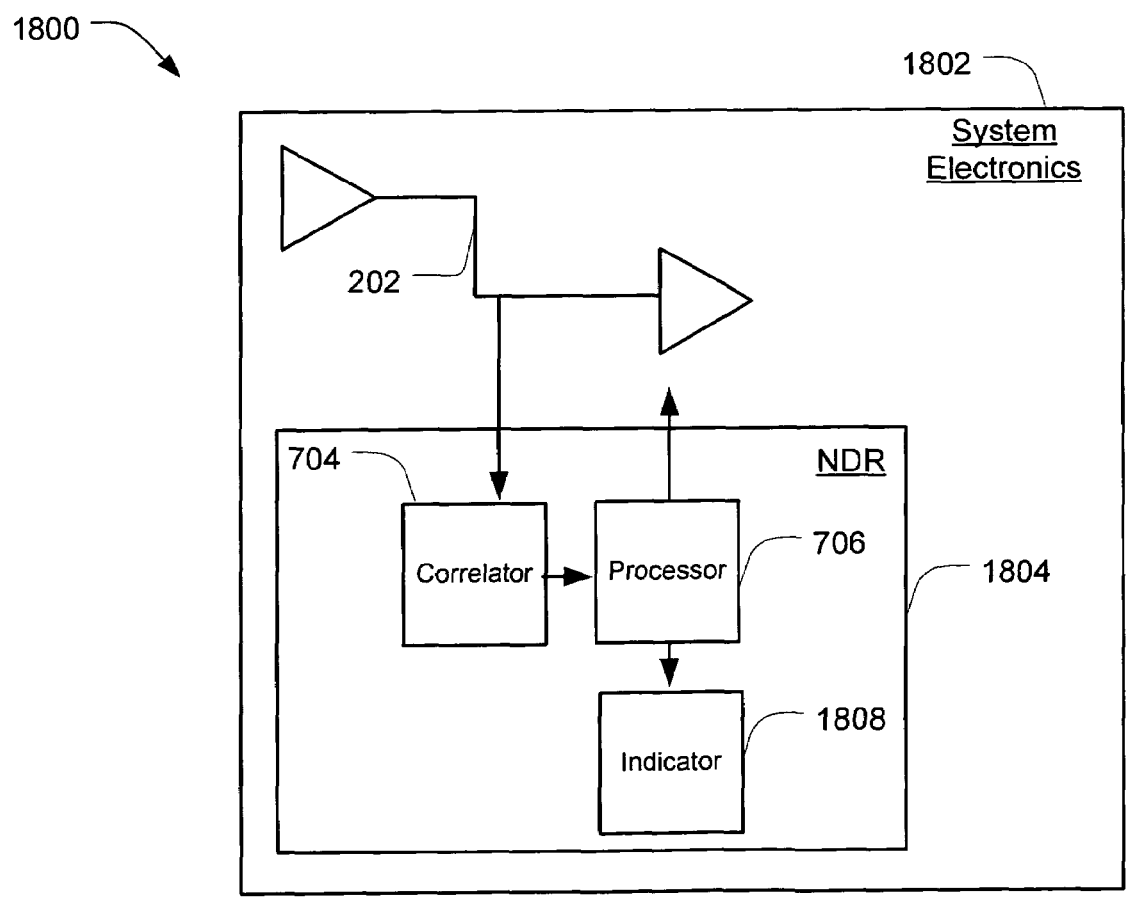
FIG. 18 is a block diagram of a system providing self-test capability in accordance with an embodiment of the present invention.

In accordance with another embodiment of the present invention, a system providing self-test capability may be implemented as illustrated in FIG. 18. The system 1800 may include system electronics 1802, including at least one signal path 202 carrying an operational signal that is used by the system during operation. The system may further include one or more noise domain reflectometers (NDR) 1804 coupled to the signal paths. The NDR may include a correlator 704 coupled to the signal path and configured to estimate a correlation of the operational signal. The NDR may further include a processor 706 coupled to the correlator and configured to determine the presence of an anomaly in the signal path. The NDR may further include an indicator 1808 coupled to the processor and configured to provide an indication when the anomaly is present. For example, the indicator may provide a simple good/bad indication, or the indicator may provide the location of the anomaly. The NDR may be further configured so that the processor is coupled to the system so that operation of the system is modified when the anomaly is present.

For example, the NDR may be configured to adjust an impedance of a component to minimize the reflection (e.g. an adaptive antenna tuner) based on the correlation.

In another example, the NDR may be configured to act as a circuit breaker by connecting the processor to a switch that will open a circuit when an anomaly indicating a short circuit is present.

There are many applications for the presently disclosed inventive concepts disclosed herein; following are several exemplary embodiments using the technology. Other applications of the presently disclosed technology will be readily apparent to one of ordinary skill in the art. For each of the below embodiments, the term system is intended to refer to any of the above disclosed embodiments of the present invention.

Handheld Tester. A handheld meter may contain the system and provide capability to measure wire length or find faults. A handheld meter may be attached to wiring through a test probe, or at any ordinary junction point, e.g., circuit breaker, connector, wiring integration unit and junction box. For example, the end of a wire results in an impedance discontinuity which resulting in a reflection and corresponding peak in the correlation. The system may be used to test one wire alone or to test a set of wires. To test a set of wires, a multiplexer or switch may be used to alternately connect the system to each wire individually. Testing may be performed while the system is operational (using the operational signal), or while the system is non-operational (using an injected noise-like signal).

Circuit Breaker. A circuit breaker is a commonly available junction point in a circuit. The system may be integrated into existing or new circuit breakers, or otherwise placed within the circuit breaker panel, and used to for measuring wire length and finding faults. The system may be used in conjunction with the circuit breaker, or may replace it. One of the common advantages of placing the system in the circuit breaker area or panel is that some power is normally available for powering the system. The system may be used to locate arcs, i.e., small intermittent short or open circuits. The system may be used to detect the location of short and open circuits. Even if the circuit path under test is not fully open or short-circuited and an intermittent arc occurs, a peak in the correlation will appear that represents the location of the arc. Several readings may be stored, and compared sequentially. The maximum differences between the average or median of the readings may be obtained. The arc will show up as a peak in the maximum difference data at the location proportional to the location of the arc.

Connector. A connector for wiring may contain the system. Existing connectors may be replaced by system-enabled connectors, or a separate "connector-saver" that has male pins on one side and female sockets on the other, with the system included within the connector-saver. Then the existing connectors may be plugged into either side of this connector-saver. There are a number of options in powering the system included within a connector. For example, the system may connect to power within the bundle being tested. Alternatively, the system may include a battery (possibly rechargeable). Yet another alternative, in the context of aircraft wiring, the system may scavenge power from the aircraft surroundings using vibration, thermal changes, or other known power scavenging methods. In addition, the connector may include a communication interface to get the data back to a central location for examination by a maintenance technician, pilot, remote decision-making interface, or the like. For example, each connector may include a communication link that is either hard-wired or wireless, e.g., RF, IR, etc. Alternately, the connector may be suitable for visual examination, for example by including a set of light emitting diode indicator outputs, or a hard-wired or wireless connection between a handheld PDA. If there are more than two wires within the bundle, the connector may include a multiplexer or set of switches to test each of the wires separately. Alternatively, several systems may be built into a single chip, imbedded into the connector and configured to test the set of several wires simultaneously.

Junction Box or Panel. The system may be integrated into a junction box or panel. Such boxes, often called wiring integration units, may provide a convenient location for integrating the system into an existing electronic system.

Integrated testing. The system may be integrated into a new electronic system by including the system electronics within components, circuit boards, or sub-assemblies of the system.

Wiring. It has been contemplated that as the electronics for the system are reduced in size by manufacturing improvements and miniaturization, the system may be imbedded directly within a roll of wiring. Multiple or single systems may be included within a roll of wiring. This application is particularly appealing for new types of wires that are being examined that are extruded and may be connected onto small circuit boards rather than the traditional connectors or for wires that are built on rolls of high-impedance plastic. These are the same materials, in some cases, that flexible circuit boards can be built on and, thus, that the system may be attached to.

Wireless Ranging. Another embodiment for the system is ranging, i.e., finding the distance. For example, the system may be used for determining a distance between two wireless transmitters or for ranging in radar or other wireless applications. In such an application, the signal path is a wireless propagation path, and the operation is as described above. As the reflections in such an application are weak, improved dynamic range in the correlator may be obtained by performing long a integration or summation.

Networks. The system may also be used to test wiring networks, such as those found on aircraft. It is noted that many times wires branch throughout the plane, so that when a system is connected to a single connector, it may actually be testing a series of wires with multiple branches, much like the branches of a tree. Each junction between two wires and the end of each branch will produce a reflection and create a corresponding peak (or peaks) in the correlation. In addition, there are multiple reflections as the reflection from the end re-enters the branch, and both reflections transmit towards and away from the operational signal source. Hence, multiple peaks may show up in the correlation, which may be sorted out using the techniques disclosed herein and, if available, knowledge of the cable tree.

Self-Healing Systems. Once the delay(s) in the system caused by the reflections in the wiring network have been determined, the delay(s) may be used in processing the signal. The data on a line in the wiring network is the sum of the initial signal and a delayed and possibly attenuated version of signal. This is commonly done in communication systems. One common way of doing this is to use a matched filter (digital or analog), a "rake" receiver, or any other type of correlator or synchronizer. The reflected signal or sum of reflected and incident signals is progressively delayed and compared or correlated to the original signal. When the delay(s) is the same as the delay(s) obtained from the path (the network of wires or the multipath environment of the communication system), the signals are highly correlated (they are "identical"). This gives a correlation peak. The signals may be simply added together to obtain the original signal (as they are in a "rake" receiver, for instance). This data-extraction method is useful in a high-speed data network because if the line breaks, all users, not just those beyond the break, may be unable to receive the data because it is corrupted by the reflected signal. This data-extraction method can be used to allow the system to "self-heal," so that all users connected prior to the break on the line are still able to receive data. In "ring networks" that connect all users in a circular fashion, this may ensure that all users may continue to receive data. This method may be used as a temporary "fix" until maintenance personnel arrived. Additionally, when maintenance personnel do arrive, the system may convey the specific location of the fault for quick repair.

Height and Properties of Materials. The system can be used to determine the height of materials, e.g., grains/granular materials, water/fluids, etc., by measuring the length and multiple reflections on a wire imbedded in the material. Furthermore, the system can be used to determine the electrical properties of materials and, thus, physical parameters such as moisture, salinity, fat/water content, etc.

It is to be understood that the above-referenced embodiments and applications are illustrative of the application for the principles of the present invention. Numerous modifications and alternative arrangements may be devised without departing from the spirit and scope of the present invention. While the present invention has been shown in the drawings and described above in connection with the exemplary embodiments of the invention, it will be apparent to those of ordinary skill in the art that numerous modifications can be made without departing from the principles and concepts of the invention as set forth in the claims.

What is claimed is:

1. A method of testing a signal path comprising:
   a) receiving an operational signal from the signal path, wherein the operational signal is present within the system during operation and is not an injected test signal;
   b) estimating a correlation of the operational signal at a time-offset wherein the correlation is the expectation of the product of the operational signal and a reference signal; and
   c) determining a characteristic of the signal path from the correlation.

2. The method of claim 1 wherein the operational signal has reflections caused by at least one impedance discontinuity in the signal path.

3. The method of claim 1 wherein:
   receiving an operational signal comprises separating a main portion of the operational signal from a reflected portion of the operational signal; and
   estimating a correlation of the operational signal comprises estimating a cross-correlation of the main portion of the operational signal using the reflected portion of the operational signal as the reference signal.

4. The method of claim 1 wherein estimating a correlation of the operational signal comprises estimating an autocorrelation of the operational signal using the operational signal as the reference signal.

5. The method of claim 1 wherein estimating a correlation of the operational signal comprises estimating a plurality of correlation values corresponding to a plurality of time-offsets.

6. The method of claim 1 wherein estimating a correlation of the operational signal comprises:
   sampling the operational signal at a plurality of first sample times to form a plurality of first samples;
   sampling the operational signal at a plurality of second sample times to form a plurality of corresponding second samples wherein each corresponding second sample time is delayed by the time-offset from each first sample time;
   multiplying each of the plurality of first samples by the corresponding second samples to form a plurality of products; and
   summing the plurality of products to form the correlation.

7. The method of claim 1 wherein determining a characteristic of the signal path further comprises determining a length of the signal path based on a reflection corresponding to an end of the signal path.

8. The method of claim 1 wherein determining a characteristic of the signal path further comprises comparing the correlation to a baseline correlation.

9. The method of claim 1 further comprising frequency-shifting a spectrum of the operational signal to produce a frequency-shifted signal and wherein estimating the correlation is estimated from the frequency-shifted signal.

10. The method of claim 1 further comprising modifying the operational signal to improve a ratio of a nominal peak of the correlation to a nominal sidelobe level of the correlation.

11. The method of claim 10, wherein modifying the operational signal comprises adding a noise-like signal to the operational signal.

12. The method of claim 1 wherein the operational signal is distorted by reflections from an anomaly in the signal path.

13. The method of claim 12 wherein determining a characteristic of the signal path further comprises determining a distance to the anomaly based on the time-offset for which the correlation is at an extremum.

14. The method of claim 12 wherein determining a characteristic of the signal path further comprises determining an impedance of the anomaly based on an extremum of the correlation.

15. A method of testing a signal path having at least one anomaly comprising:
   extracting from the signal path a forward portion of an operational signal within the signal path wherein the operational signal is present within the system during operation and is not an injected test signal;
   extracting from the signal path a reflection of the operational signal introduced by the at least one anomaly;
   estimating a plurality of cross-correlation values of the forward portion of the operational signal and the reflection of the operational signal corresponding to a plurality of relative time-offsets between the forward portion of the operational signal and the reflection of the operational signal wherein the cross-correlation is the expectation of the product of the forward portion of the operational signal and the reflection of the operational signal; and
   finding a first extremum of the plurality of cross-correlation values corresponding to a first one of the at least one anomaly.

16. The method of claim 15, further comprising finding a second extremum of the plurality of correlation values corresponding to a second one of the at least one anomaly.

17. A method of testing a signal path having a plurality of anomalies comprising:
   extracting a portion of an operational signal from the signal path, the operational signal having distortion introduced by the plurality of anomalies wherein the operational signal is present within the system during operation and is not an injected test signal;
   a. estimating an autocorrelation of the operational signal at a plurality of time offsets wherein the autocorrelation is the expectation of the product of the operational signal with a time offset version of the operational signal;
   b. determining a number of peaks of the autocorrelation; and
   c. calculating a number of anomalies from the number of peaks.

18. The method of claim 17, further comprising determining a distance to one of the plurality of anomalies.

19. The method of claim 17, wherein determining a distance to one of the plurality of anomalies comprises pattern-matching the autocorrelation with an expected distribution of peaks to determine a location of one of the plurality of anomalies.

20. A system for testing a signal path having an operational signal comprising:
   an extractor configured to extract a sample of the operational signal when coupled to a signal path wherein the operational signal is present within the system during operation and is not an injected test signal;
   a correlator coupled to the extractor and configured to estimate a correlation of the sample of operational signal at an at least one time-offset;
   a processor coupled to the correlator and configured to determine a characteristic of the signal path from the correlation.

21. The system of claim 20, wherein the correlator is further configured to estimate an auto-correlation of the operational signal.

22. The system of claim 20, wherein the extractor comprises:
   a first directional coupler configured to extract a sample of a forward portion of the operational signal when coupled to the signal path; and
   a second directional coupler configured to extract a sample of a reflected portion of the operational signal when coupled to the signal path;
   wherein the correlator is further configured to estimate a cross-correlation of the sample of the reflected portion and the sample of the forward portion of the operational signal.

23. The system of claim 20, wherein the correlator is further configured to estimate the correlation at a plurality of time-offsets.

24. The system of claim 20, further comprising a time-offset control coupled to the correlator and configured to vary the time-offset from a minimum value to a maximum value corresponding to a range of time-offsets for which the correlation is to be estimated.

25. The system of claim 24, further comprising a rate control coupled to the time-offset control and configured to control a rate at which the time-offset is varied so that the rate is reduced when the correlation indicates that the current time-offset is near a delay corresponding to an extremum of the correlation.

26. The system of claim 20, where the correlator comprises:
   a variable delay element coupled to the extractor and configured to introduce a variable time delay to produce a delayed sample of the operational signal;
   a multiplier coupled to the variable delay element and coupled to the extractor and configured to multiply the delayed sample by the delayed operational signal and output a multiplication product;
   an integrator coupled to the multiplier and configured to integrate the multiplication product to form the correlation.

27. The system of claim 20, further comprising a plurality of correlators configured to estimate the correlation for a plurality of time-offsets substantially simultaneously.

28. The system of claim 20, further comprising a media interface coupled to the extractor and configured to modify an electrical property of the operational signal chosen from the group of electrical properties consisting of frequency, voltage, current, and impedance.

29. The system of claim 20, further comprising
   a memory component configured to store a baseline correlation; and
   a comparator configured to compare the correlation to the baseline correlation whereby changes in the signal path can be detected.

30. The system of claim 20, wherein the correlator comprises:
   a first sample and hold coupled the extractor and configured to take a first sample of the operational signal;
   a second sample and hold coupled to the extractor and configured to take a second sample of the operational signal;

a variable trigger delay connected between the first and second sample and hold and configured to cause the first sample and hold to be triggered with time-offset relative to the second sample and hold;

a multiplier connected to the first and second sample and hold and configured to form a product from the first sample and the second sample;

a third sample and hold configured to sample the product when the product is stable to produce a held product; and an integrator configured to accept and integrate the held product to form the correlation.

31. The system of claim 20, wherein said system is integrated into a system element chosen from the group of system elements consisting of a circuit breaker, a connector, a connector saver, a wiring integration unit, and a junction box.

32. The system of claim 20, further comprising a noise-generator coupled to the extractor and configured to superimpose a noise-like signal on the operational signal when coupled to the signal path.

33. A system providing self-test capability comprising:

at least one signal path carrying an operational signal used by the system during operation wherein the operational signal is not an injected test signal;

at least one noise domain reflectometer coupled to the at least one signal path adapted to monitor the signal path during operation of the system wherein the noise domain reflectometer comprises:

a correlator coupled to the signal path and configured to estimate a correlation of the operational signal;

a processor coupled to the correlator and configured to determine a characteristic of the signal path.

34. The system of claim 33, further comprising an indicator coupled to the processor and configured to provide an indication when an anomaly is present.

35. The system of claim 33, wherein the processor is coupled to the system in a configuration such that operation of the system is modified when the anomaly is present.

* * * * *